(12) United States Patent
Snyder et al.

(10) Patent No.: US 9,843,327 B1
(45) Date of Patent: Dec. 12, 2017

(54) PSOC ARCHITECTURE

(71) Applicant: Cypress Semiconductor Corporation, San Jose, CA (US)

(72) Inventors: Warren S. Snyder, Snohomish, WA (US); Monte Mar, Issaquah, WA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/283,888

(22) Filed: May 21, 2014

Related U.S. Application Data

(63) Continuation of application No. 13/328,385, filed on Dec. 16, 2011, now Pat. No. 8,736,303, which is a continuation of application No. 12/902,137, filed on Oct. 11, 2010, now Pat. No. 8,358,150, which is a continuation of application No. 11/799,439, filed on Apr. 30, 2007, now Pat. No. 7,825,688, which is a continuation of application No. 10/803,030, filed on Mar. 16, 2004, now Pat. No. 7,221,187, which is a continuation of application No. 09/924,734, filed on Aug. 7, 2001, now Pat. No. 6,724,220.

(60) Provisional application No. 60/243,708, filed on Oct. 26, 2000.

(51) Int. Cl.
*G06F 7/38* (2006.01)
*H03K 19/173* (2006.01)
*H03K 19/177* (2006.01)

(52) U.S. Cl.
CPC ......... *H03K 19/173* (2013.01); *H03K 19/177* (2013.01); *H03K 19/17736* (2013.01)

(58) Field of Classification Search
None
See application file for complete search history.

(56) References Cited

U.S. PATENT DOCUMENTS

| | | |
|---|---|---|
| 3,600,690 A | 8/1971 | Graham |
| 3,725,804 A | 4/1973 | Langan |
| 3,740,588 A | 6/1973 | Stratton et al. |
| 3,805,245 A | 4/1974 | Brooks et al. |
| 3,810,036 A | 5/1974 | Bloedom |
| 3,831,113 A | 8/1974 | Ahmed |
| 3,845,328 A | 10/1974 | Hollingsworth |
| 3,940,760 A | 2/1976 | Brokaw |

(Continued)

FOREIGN PATENT DOCUMENTS

| | | |
|---|---|---|
| DE | 19710829 C2 | 9/1998 |
| DE | 19742577 C1 | 11/1998 |

(Continued)

OTHER PUBLICATIONS

USPTO Advisory Action for U.S. Appl. No. 09/975,338 dated May 11, 2007; 3 pages.

(Continued)

*Primary Examiner* — Anh Tran

(57) ABSTRACT

A circuit with a plurality of analog circuit blocks, each configured to provide at least one analog function and a programmable interconnect coupled of the analog circuit blocks and configurable to interconnect combinations of the analog circuit blocks to one another. The circuit is formed in an integrated circuit (chip) and the programmable interconnect comprises a plurality of switches coupled between the analog circuit blocks and ports that provide signal connections for the chip.

20 Claims, 4 Drawing Sheets

(56) References Cited

U.S. PATENT DOCUMENTS

| | | | |
|---|---|---|---|
| 4,061,987 A | 12/1977 | Nagahama | |
| 4,134,073 A | 1/1979 | MacGregor | |
| 4,138,671 A | 2/1979 | Comer et al. | |
| 4,176,258 A | 11/1979 | Jackson | |
| 4,250,464 A | 2/1981 | Schade | |
| 4,272,760 A | 6/1981 | Prazak et al. | |
| 4,283,713 A | 8/1981 | Philipp | |
| 4,326,135 A | 4/1982 | Jarrett et al. | |
| 4,344,067 A | 8/1982 | Lee | |
| 4,380,083 A | 4/1983 | Andersson et al. | |
| 4,438,404 A | 3/1984 | Philipp | |
| 4,475,151 A | 10/1984 | Philipp | |
| 4,497,575 A | 2/1985 | Philipp | |
| 4,604,363 A | 8/1986 | Newhouse et al. | |
| 4,608,502 A | 8/1986 | Dijkmans et al. | |
| 4,656,603 A | 4/1987 | Dunn | |
| 4,670,838 A | 6/1987 | Kawata | |
| 4,689,740 A | 8/1987 | Moelands et al. | |
| 4,692,718 A | 9/1987 | Roza et al. | |
| 4,701,907 A | 10/1987 | Collins | |
| 4,727,541 A | 2/1988 | Mori et al. | |
| 4,736,097 A | 4/1988 | Philipp | |
| 4,740,966 A | 4/1988 | Goad | |
| 4,755,766 A | 7/1988 | Metz | |
| 4,757,534 A | 7/1988 | Matyas et al. | |
| 4,773,024 A | 9/1988 | Faggin et al. | |
| 4,794,558 A | 12/1988 | Thompson | |
| 4,802,103 A | 1/1989 | Faggin et al. | |
| 4,802,119 A | 1/1989 | Heene et al. | |
| 4,807,183 A | 2/1989 | Kung et al. | |
| 4,809,345 A | 2/1989 | Tabata et al. | |
| 4,812,684 A | 3/1989 | Yamagiwa et al. | |
| 4,813,013 A | 3/1989 | Dunn | |
| 4,827,401 A | 5/1989 | Hrustich et al. | |
| 4,831,546 A | 5/1989 | Mitsuta et al. | |
| 4,833,418 A | 5/1989 | Quintus et al. | |
| 4,868,525 A | 9/1989 | Dias | |
| 4,876,466 A | 10/1989 | Kondou et al. | |
| 4,876,534 A | 10/1989 | Mead et al. | |
| 4,878,200 A | 10/1989 | Asghar et al. | |
| 4,879,461 A | 11/1989 | Philipp | |
| 4,879,688 A | 11/1989 | Turner et al. | |
| 4,885,484 A | 12/1989 | Gray | |
| 4,907,121 A | 3/1990 | Hrassky | |
| 4,922,492 A | 5/1990 | Fasang et al. | |
| 4,935,702 A | 6/1990 | Mead et al. | |
| 4,939,637 A | 7/1990 | Pawloski | |
| 4,942,540 A | 7/1990 | Black et al. | |
| 4,947,169 A | 8/1990 | Smith et al. | |
| 4,953,928 A | 9/1990 | Anderson et al. | |
| 4,962,342 A | 10/1990 | Mead et al. | |
| 4,964,074 A | 10/1990 | Suzuki et al. | |
| 4,969,087 A | 11/1990 | Tanagawa et al. | |
| 4,970,408 A | 11/1990 | Hanke et al. | |
| 4,972,372 A | 11/1990 | Ueno | |
| 4,977,381 A | 12/1990 | Main | |
| 4,980,652 A | 12/1990 | Tarusawa et al. | |
| 4,999,519 A | 3/1991 | Kitsukawa et al. | |
| 5,043,674 A | 8/1991 | Bonaccio et al. | |
| 5,049,758 A | 9/1991 | Mead et al. | |
| 5,050,168 A | 9/1991 | Paterson | |
| 5,053,949 A | 10/1991 | Allison et al. | |
| 5,055,827 A | 10/1991 | Philipp | |
| 5,059,920 A | 10/1991 | Anderson et al. | |
| 5,068,622 A | 11/1991 | Mead et al. | |
| 5,073,759 A | 12/1991 | Mead et al. | |
| 5,083,044 A | 1/1992 | Mead et al. | |
| 5,088,822 A | 2/1992 | Warren | |
| 5,095,284 A | 3/1992 | Mead | |
| 5,097,305 A | 3/1992 | Mead et al. | |
| 5,099,191 A | 3/1992 | Galler et al. | |
| 5,107,146 A | 4/1992 | El-Ayat | |
| 5,107,149 A | 4/1992 | Platt et al. | |
| 5,109,261 A | 4/1992 | Mead et al. | |
| 5,119,038 A | 6/1992 | Anderson et al. | |
| 5,120,996 A | 6/1992 | Mead et al. | |
| 5,122,800 A | 6/1992 | Philipp | |
| 5,126,685 A | 6/1992 | Platt et al. | |
| 5,126,759 A | 6/1992 | Small et al. | |
| 5,127,103 A | 6/1992 | Hill et al. | |
| 5,128,871 A | 7/1992 | Schmitz | |
| 5,136,188 A | 8/1992 | Ha et al. | |
| 5,140,197 A | 8/1992 | Grider | |
| 5,142,247 A | 8/1992 | Lada, Jr. et al. | |
| 5,144,242 A | 9/1992 | Zeilenga et al. | |
| 5,144,582 A | 9/1992 | Steele | |
| 5,146,106 A | 9/1992 | Anderson et al. | |
| 5,150,079 A | 9/1992 | Williams et al. | |
| 5,155,836 A | 10/1992 | Jordan et al. | |
| 5,159,292 A | 10/1992 | Canfield et al. | |
| 5,159,335 A | 10/1992 | Veneruso | |
| 5,160,899 A | 11/1992 | Anderson et al. | |
| 5,161,124 A | 11/1992 | Love | |
| 5,165,054 A | 11/1992 | Platt et al. | |
| 5,166,562 A | 11/1992 | Allen et al. | |
| 5,175,884 A | 12/1992 | Suarez | |
| 5,179,531 A | 1/1993 | Yamaki | |
| 5,184,061 A | 2/1993 | Lee et al. | |
| 5,196,740 A * | 3/1993 | Austin | 327/566 |
| 5,198,817 A | 3/1993 | Walden et al. | |
| 5,200,751 A | 4/1993 | Smith | |
| 5,202,687 A | 4/1993 | Distinti | |
| 5,204,549 A | 4/1993 | Platt et al. | |
| 5,206,582 A | 4/1993 | Ekstedt et al. | |
| 5,220,512 A | 6/1993 | Watkins et al. | |
| 5,225,991 A | 7/1993 | Dougherty | |
| 5,230,000 A | 7/1993 | Mozingo et al. | |
| 5,235,617 A | 8/1993 | Mallard, Jr. | |
| 5,241,492 A | 8/1993 | Girardeau, Jr. | |
| 5,243,554 A | 9/1993 | Allen et al. | |
| 5,245,262 A | 9/1993 | Moody et al. | |
| 5,248,843 A | 9/1993 | Billings | |
| 5,248,873 A | 9/1993 | Allen et al. | |
| 5,258,760 A | 11/1993 | Moody et al. | |
| 5,260,592 A | 11/1993 | Mead et al. | |
| 5,260,979 A | 11/1993 | Parker et al. | |
| 5,270,963 A | 12/1993 | Allen et al. | |
| 5,276,407 A | 1/1994 | Mead et al. | |
| 5,276,739 A | 1/1994 | Krokstad et al. | |
| 5,276,890 A | 1/1994 | Arai | |
| 5,280,199 A | 1/1994 | Itakura | |
| 5,280,202 A | 1/1994 | Chan et al. | |
| 5,289,023 A | 2/1994 | Mead | |
| 5,303,329 A | 4/1994 | Mead et al. | |
| 5,304,955 A | 4/1994 | Atriss et al. | |
| 5,305,017 A | 4/1994 | Gerpheide | |
| 5,305,312 A | 4/1994 | Fornek et al. | |
| 5,307,381 A | 4/1994 | Ahuja | |
| 5,313,618 A | 5/1994 | Pawloski | |
| 5,317,202 A | 5/1994 | Waizman | |
| 5,319,370 A | 6/1994 | Del Signore et al. | |
| 5,319,771 A | 6/1994 | Takeda | |
| 5,321,828 A | 6/1994 | Phillips et al. | |
| 5,324,958 A | 6/1994 | Mead et al. | |
| 5,325,512 A | 6/1994 | Takahashi | |
| 5,329,471 A | 7/1994 | Swoboda et al. | |
| 5,331,215 A | 7/1994 | Allen et al. | |
| 5,331,315 A | 7/1994 | Crosette | |
| 5,331,571 A | 7/1994 | Aronoff et al. | |
| 5,334,952 A | 8/1994 | Maddy et al. | |
| 5,335,342 A | 8/1994 | Pope et al. | |
| 5,336,936 A | 8/1994 | Allen et al. | |
| 5,339,213 A | 8/1994 | O'Callaghan | |
| 5,339,262 A | 8/1994 | Rostoker et al. | |
| 5,341,044 A | 8/1994 | Ahanin et al. | |
| 5,341,267 A | 8/1994 | Whitten et al. | |
| 5,345,195 A | 9/1994 | Cordoba et al. | |
| 5,349,303 A | 9/1994 | Gerpheide | |
| 5,355,097 A | 10/1994 | Scott et al. | |
| 5,357,626 A | 10/1994 | Johnson et al. | |
| 5,361,290 A | 11/1994 | Akiyama | |
| 5,371,524 A | 12/1994 | Herczeg et al. | |
| 5,371,860 A | 12/1994 | Mura et al. | |
| 5,371,878 A | 12/1994 | Coker | |

(56) References Cited

U.S. PATENT DOCUMENTS

| | | |
|---|---|---|
| 5,371,883 A | 12/1994 | Gross et al. |
| 5,374,787 A | 12/1994 | Miller et al. |
| 5,377,333 A | 12/1994 | Nakagoshi et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,390,173 A | 2/1995 | Spinney et al. |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,408,235 A | 4/1995 | Doyle et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong |
| 5,426,384 A | 6/1995 | May |
| 5,428,319 A | 6/1995 | Marvin et al. |
| 5,430,395 A | 7/1995 | Ichimaru |
| 5,430,687 A | 7/1995 | Hung et al. |
| 5,430,734 A | 7/1995 | Gilson |
| 5,432,476 A | 7/1995 | Tran |
| 5,438,672 A | 8/1995 | Dey |
| 5,440,305 A | 8/1995 | Signore et al. |
| 5,442,772 A | 8/1995 | Childs et al. |
| 5,451,887 A | 9/1995 | El Ayat et al. |
| 5,453,904 A | 9/1995 | Higashiyama et al. |
| 5,455,525 A | 10/1995 | Ho et al. |
| 5,455,731 A | 10/1995 | Parkinson |
| 5,455,927 A | 10/1995 | Huang |
| 5,457,410 A | 10/1995 | Ting |
| 5,457,479 A | 10/1995 | Cheng |
| 5,463,591 A | 10/1995 | Aimoto et al. |
| 5,479,603 A | 12/1995 | Stone et al. |
| 5,479,643 A | 12/1995 | Bhaskar et al. |
| 5,479,652 A | 12/1995 | Dreyer et al. |
| 5,481,471 A | 1/1996 | Naglestad et al. |
| 5,488,204 A | 1/1996 | Mead et al. |
| 5,491,458 A | 2/1996 | Mccune, Jr. et al. |
| 5,493,246 A | 2/1996 | Anderson |
| 5,493,723 A | 2/1996 | Beck et al. |
| 5,495,077 A | 2/1996 | Miller et al. |
| 5,495,593 A | 2/1996 | Elmer et al. |
| 5,495,594 A | 2/1996 | Mackenna et al. |
| 5,497,119 A | 3/1996 | Tedrow et al. |
| 5,499,192 A | 3/1996 | Knapp et al. |
| 5,500,823 A | 3/1996 | Martin et al. |
| 5,517,198 A | 5/1996 | Mcewan |
| 5,519,854 A | 5/1996 | Watt |
| 5,521,529 A | 5/1996 | Agrawal et al. |
| 5,530,444 A | 6/1996 | Tice et al. |
| 5,530,673 A | 6/1996 | Tobita et al. |
| 5,530,813 A | 6/1996 | Paulsen et al. |
| 5,537,057 A | 7/1996 | Leong et al. |
| 5,541,878 A | 7/1996 | LeMoncheck et al. |
| 5,542,055 A | 7/1996 | Amini et al. |
| 5,543,588 A | 8/1996 | Bisset et al. |
| 5,543,590 A | 8/1996 | Gillespie et al. |
| 5,543,591 A | 8/1996 | Gillespie et al. |
| 5,544,067 A | 8/1996 | Rostoker et al. |
| 5,544,311 A | 8/1996 | Harenberg et al. |
| 5,546,433 A | 8/1996 | Tran et al. |
| 5,546,562 A | 8/1996 | Patel |
| 5,552,725 A | 9/1996 | Ray et al. |
| 5,552,748 A | 9/1996 | O'Shaughnessy |
| 5,554,951 A | 9/1996 | Gough |
| 5,555,452 A | 9/1996 | Callaway et al. |
| 5,555,907 A | 9/1996 | Philipp |
| 5,557,762 A | 9/1996 | Okuaki et al. |
| 5,559,502 A | 9/1996 | Schutte |
| 5,559,996 A | 9/1996 | Fujioka |
| 5,563,526 A * | 10/1996 | Hastings ............ H03K 19/1736 326/37 |
| 5,563,529 A | 10/1996 | Seltzer et al. |
| 5,564,010 A | 10/1996 | Henry et al. |
| 5,564,108 A | 10/1996 | Hunsaker et al. |
| 5,565,658 A | 10/1996 | Gerpheide et al. |
| 5,566,702 A | 10/1996 | Philipp |
| 5,572,665 A | 11/1996 | Nakabayashi |
| 5,572,719 A | 11/1996 | Biesterfeldt |
| 5,574,678 A | 11/1996 | Gorecki |
| 5,574,852 A | 11/1996 | Bakker et al. |
| 5,574,892 A | 11/1996 | Christensen |
| 5,579,353 A | 11/1996 | Parmenter et al. |
| 5,587,945 A | 12/1996 | Lin et al. |
| 5,587,957 A | 12/1996 | Kowalczyk et al. |
| 5,590,354 A | 12/1996 | Klapproth et al. |
| 5,594,388 A | 1/1997 | O'Shaughnessy et al. |
| 5,594,734 A | 1/1997 | Worsley et al. |
| 5,594,876 A | 1/1997 | Getzlaff et al. |
| 5,594,890 A | 1/1997 | Yamaura et al. |
| 5,598,408 A | 1/1997 | Nickolls et al. |
| 5,600,262 A | 2/1997 | Kolze |
| 5,604,450 A | 2/1997 | Borkar et al. |
| 5,604,466 A | 2/1997 | Dreps et al. |
| 5,608,892 A | 3/1997 | Wakerly |
| 5,614,861 A | 3/1997 | Harada |
| 5,625,316 A | 4/1997 | Chambers et al. |
| 5,625,583 A | 4/1997 | Hyatt |
| 5,629,857 A | 5/1997 | Brennan |
| 5,629,891 A | 5/1997 | LeMoncheck et al. |
| 5,630,052 A | 5/1997 | Shah |
| 5,630,057 A | 5/1997 | Hait |
| 5,630,102 A | 5/1997 | Johnson et al. |
| 5,631,577 A | 5/1997 | Freidin et al. |
| 5,633,766 A | 5/1997 | Hase et al. |
| 5,635,745 A | 6/1997 | Hoeld |
| 5,642,295 A | 6/1997 | Smayling |
| 5,646,544 A | 7/1997 | Ladanza |
| 5,646,901 A | 7/1997 | Sharpe-Geisler et al. |
| 5,648,642 A | 7/1997 | Miller et al. |
| 5,651,035 A | 7/1997 | Tozun et al. |
| 5,652,893 A | 7/1997 | Ben-Meir et al. |
| 5,661,433 A | 8/1997 | LaRosa et al. |
| 5,663,900 A | 9/1997 | Bhandari et al. |
| 5,663,965 A | 9/1997 | Seymour |
| 5,664,199 A | 9/1997 | Kuwahara |
| 5,666,480 A | 9/1997 | Leung et al. |
| 5,668,550 A | 9/1997 | Coleman, Jr. |
| 5,670,915 A | 9/1997 | Cooper et al. |
| 5,673,198 A | 9/1997 | Lawman et al. |
| 5,675,825 A | 10/1997 | Dreyer et al. |
| 5,677,691 A | 10/1997 | Hosticka et al. |
| 5,680,070 A | 10/1997 | Anderson et al. |
| 5,682,032 A | 10/1997 | Philipp |
| 5,684,434 A | 11/1997 | Mann et al. |
| 5,684,952 A | 11/1997 | Stein |
| 5,686,844 A | 11/1997 | Hull et al. |
| 5,687,325 A | 11/1997 | Chang |
| 5,689,195 A | 11/1997 | Cliff et al. |
| 5,689,196 A | 11/1997 | Schutte |
| 5,691,664 A | 11/1997 | Anderson et al. |
| 5,691,898 A | 11/1997 | Rosenberg et al. |
| 5,694,063 A | 12/1997 | Burlison et al. |
| 5,696,952 A | 12/1997 | Pontarelli |
| 5,699,024 A | 12/1997 | Manlove et al. |
| 5,703,871 A | 12/1997 | Pope et al. |
| 5,706,453 A | 1/1998 | Cheng et al. |
| 5,708,589 A | 1/1998 | Beauvais |
| 5,708,798 A | 1/1998 | Lynch et al. |
| 5,710,906 A | 1/1998 | Ghosh et al. |
| 5,712,969 A | 1/1998 | Zimmermann et al. |
| 5,721,931 A | 2/1998 | Gephardt et al. |
| 5,724,009 A | 3/1998 | Collins et al. |
| 5,727,170 A | 3/1998 | Mitchell et al. |
| 5,728,933 A | 3/1998 | Schultz et al. |
| 5,729,704 A | 3/1998 | Stone et al. |
| 5,730,165 A | 3/1998 | Philipp |

(56) References Cited

U.S. PATENT DOCUMENTS

| | | |
|---|---|---|
| 5,732,277 A | 3/1998 | Kodosky et al. |
| 5,734,272 A | 3/1998 | Belot et al. |
| 5,734,334 A | 3/1998 | Hsieh et al. |
| 5,737,557 A | 4/1998 | Sullivan |
| 5,737,760 A | 4/1998 | Grimmer et al. |
| 5,745,011 A | 4/1998 | Scott |
| 5,748,048 A | 5/1998 | Moyal |
| 5,748,875 A | 5/1998 | Tzori |
| 5,751,164 A | 5/1998 | Sharpe-Geisler et al. |
| 5,752,013 A | 5/1998 | Christensen et al. |
| 5,754,552 A | 5/1998 | Allmond et al. |
| 5,754,826 A | 5/1998 | Gamal et al. |
| 5,757,298 A | 5/1998 | Manley et al. |
| 5,757,368 A | 5/1998 | Gerpheide et al. |
| 5,758,058 A | 5/1998 | Milburn |
| 5,761,128 A | 6/1998 | Watanabe |
| 5,763,909 A | 6/1998 | Mead et al. |
| 5,764,714 A | 6/1998 | Stansell et al. |
| 5,767,457 A | 6/1998 | Gerpheide et al. |
| 5,774,704 A | 6/1998 | Williams |
| 5,777,399 A | 7/1998 | Shibuya |
| 5,781,030 A | 7/1998 | Agrawal et al. |
| 5,781,747 A | 7/1998 | Smith et al. |
| 5,784,545 A | 7/1998 | Anderson et al. |
| 5,790,957 A | 8/1998 | Heidari |
| 5,796,183 A | 8/1998 | Hourmand |
| 5,797,028 A | 8/1998 | Gulick et al. |
| 5,799,176 A | 8/1998 | Kapusta et al. |
| 5,801,958 A | 9/1998 | Dangelo et al. |
| 5,802,073 A | 9/1998 | Platt |
| 5,802,290 A | 9/1998 | Casselman |
| 5,805,792 A | 9/1998 | Swoboda et al. |
| 5,805,897 A | 9/1998 | Glowny |
| 5,808,883 A | 9/1998 | Hawkes |
| 5,811,987 A | 9/1998 | Ashmore, Jr. et al. |
| 5,812,698 A | 9/1998 | Platt et al. |
| 5,815,505 A | 9/1998 | Mills |
| 5,818,254 A | 10/1998 | Agrawal et al. |
| 5,818,444 A | 10/1998 | Alimpich et al. |
| 5,818,736 A | 10/1998 | Leibold |
| 5,819,028 A | 10/1998 | Manghirmalani et al. |
| 5,822,387 A | 10/1998 | Mar |
| 5,822,531 A | 10/1998 | Gorczyca et al. |
| 5,826,093 A | 10/1998 | Assouad et al. |
| 5,828,693 A | 10/1998 | Mays et al. |
| 5,835,405 A | 11/1998 | Tsui et al. |
| 5,838,583 A | 11/1998 | Varadarajan et al. |
| 5,841,078 A | 11/1998 | Miller et al. |
| 5,841,996 A | 11/1998 | Nolan et al. |
| 5,844,256 A | 12/1998 | Mead et al. |
| 5,844,265 A | 12/1998 | Mead et al. |
| 5,844,404 A | 12/1998 | Caser et al. |
| 5,848,285 A | 12/1998 | Kapusta et al. |
| 5,850,156 A | 12/1998 | Wittman |
| 5,852,733 A | 12/1998 | Chien et al. |
| 5,854,625 A | 12/1998 | Frisch et al. |
| 5,857,109 A | 1/1999 | Taylor |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,867,046 A | 2/1999 | Sugasawa |
| 5,867,399 A | 2/1999 | Rostoker et al. |
| 5,869,979 A | 2/1999 | Bocchino |
| 5,870,004 A | 2/1999 | Lu |
| 5,870,309 A | 2/1999 | Lawman |
| 5,870,345 A | 2/1999 | Stecker |
| 5,872,464 A | 2/1999 | Gradinariu |
| 5,874,958 A | 2/1999 | Ludolph |
| 5,875,293 A | 2/1999 | Bell et al. |
| 5,877,633 A | 3/1999 | Ng et al. |
| 5,877,656 A | 3/1999 | Mann et al. |
| 5,878,425 A | 3/1999 | Redpath |
| 5,880,411 A | 3/1999 | Gillespie et al. |
| 5,880,598 A | 3/1999 | Duong |
| 5,883,623 A | 3/1999 | Cseri |
| 5,886,582 A | 3/1999 | Stansell |
| 5,887,189 A | 3/1999 | Birns et al. |
| 5,889,236 A | 3/1999 | Gillespie et al. |
| 5,889,723 A | 3/1999 | Pascucci |
| 5,889,936 A | 3/1999 | Chan |
| 5,889,988 A | 3/1999 | Held |
| 5,894,226 A | 4/1999 | Koyama |
| 5,894,243 A | 4/1999 | Hwang |
| 5,894,565 A | 4/1999 | Furtek et al. |
| 5,895,494 A | 4/1999 | Scalzi et al. |
| 5,896,068 A | 4/1999 | Moyal |
| 5,896,330 A | 4/1999 | Gibson |
| 5,898,345 A | 4/1999 | Namura et al. |
| 5,900,780 A | 5/1999 | Hirose et al. |
| 5,901,062 A | 5/1999 | Burch et al. |
| 5,903,718 A | 5/1999 | Marik |
| 5,905,398 A | 5/1999 | Todsen et al. |
| 5,909,544 A | 6/1999 | Anderson et al. |
| 5,911,059 A | 6/1999 | Profit, Jr. |
| 5,914,465 A | 6/1999 | Allen et al. |
| 5,914,633 A | 6/1999 | Comino et al. |
| 5,914,708 A | 6/1999 | LaGrange et al. |
| 5,917,356 A | 6/1999 | Casal et al. |
| 5,920,310 A | 7/1999 | Faggin et al. |
| 5,923,264 A | 7/1999 | Lavelle et al. |
| 5,926,566 A | 7/1999 | Wang et al. |
| 5,929,710 A | 7/1999 | Bien |
| 5,930,148 A | 7/1999 | Bjorksten et al. |
| 5,930,150 A | 7/1999 | Cohen et al. |
| 5,931,959 A | 8/1999 | Kwiat |
| 5,933,023 A | 8/1999 | Young |
| 5,933,356 A | 8/1999 | Rostoker et al. |
| 5,933,816 A | 8/1999 | Zeanah et al. |
| 5,935,233 A | 8/1999 | Jeddeloh |
| 5,935,266 A | 8/1999 | Thurnhofer et al. |
| 5,939,904 A | 8/1999 | Fetterman et al. |
| 5,939,949 A | 8/1999 | Olgaard et al. |
| 5,941,991 A | 8/1999 | Kageshima |
| 5,942,733 A | 8/1999 | Allen et al. |
| 5,943,052 A | 8/1999 | Allen et al. |
| 5,945,878 A | 8/1999 | Westwick et al. |
| 5,949,632 A | 9/1999 | Barreras, Sr. et al. |
| 5,952,888 A | 9/1999 | Scott |
| 5,956,279 A | 9/1999 | Mo et al. |
| 5,959,871 A | 9/1999 | Pierzchala et al. |
| 5,963,075 A | 10/1999 | Hiiragizawa |
| 5,963,105 A | 10/1999 | Nguyen |
| 5,963,503 A | 10/1999 | Lee |
| 5,964,893 A | 10/1999 | Circello et al. |
| 5,966,027 A | 10/1999 | Kapusta et al. |
| 5,966,532 A | 10/1999 | Mcdonald et al. |
| 5,968,135 A | 10/1999 | Teramoto et al. |
| 5,969,513 A | 10/1999 | Clark |
| 5,969,632 A | 10/1999 | Diamant et al. |
| 5,973,368 A | 10/1999 | Pearce et al. |
| 5,974,235 A | 10/1999 | Nunally et al. |
| 5,977,791 A | 11/1999 | Veenstra |
| 5,978,584 A | 11/1999 | Nishibata et al. |
| 5,978,937 A | 11/1999 | Miyamori et al. |
| 5,982,105 A | 11/1999 | Masters |
| 5,982,229 A | 11/1999 | Wong et al. |
| 5,982,241 A | 11/1999 | Nguyen et al. |
| 5,983,277 A | 11/1999 | Heile et al. |
| 5,986,479 A | 11/1999 | Mohan |
| 5,987,246 A | 11/1999 | Thomsen et al. |
| 5,988,902 A | 11/1999 | Holehan |
| 5,994,939 A | 11/1999 | Johnson et al. |
| 5,996,032 A | 11/1999 | Baker |
| 5,998,408 A | 12/1999 | Nickolls et al. |
| 5,999,725 A | 12/1999 | Barbier et al. |
| 6,002,268 A | 12/1999 | Sasaki et al. |
| 6,002,398 A | 12/1999 | Wilson |
| 6,003,054 A | 12/1999 | Oshima et al. |
| 6,003,107 A | 12/1999 | Ranson et al. |
| 6,003,133 A | 12/1999 | Moughanni et al. |
| 6,005,814 A | 12/1999 | Mulholland et al. |
| 6,005,904 A | 12/1999 | Knapp et al. |
| 6,008,685 A | 12/1999 | Kunst |

(56) References Cited

U.S. PATENT DOCUMENTS

| | | |
|---|---|---|
| 6,008,703 A | 12/1999 | Perrott et al. |
| 6,009,270 A | 12/1999 | Mann |
| 6,009,496 A | 12/1999 | Tsai |
| 6,011,407 A | 1/2000 | New |
| 6,012,835 A | 1/2000 | Thompson et al. |
| 6,014,135 A | 1/2000 | Fernandes |
| 6,014,509 A | 1/2000 | Furtek et al. |
| 6,014,723 A | 1/2000 | Tremblay et al. |
| 6,016,554 A | 1/2000 | Skrovan et al. |
| 6,016,563 A | 1/2000 | Fleisher |
| 6,018,559 A | 1/2000 | Azegami et al. |
| 6,023,422 A | 2/2000 | Allen et al. |
| 6,023,565 A | 2/2000 | Lawman et al. |
| 6,026,134 A | 2/2000 | Duffy et al. |
| 6,026,501 A | 2/2000 | Hohl et al. |
| 6,028,271 A | 2/2000 | Gillespie et al. |
| 6,028,959 A | 2/2000 | Wang et al. |
| 6,031,365 A | 2/2000 | Sharpe-Geisler |
| 6,031,366 A | 2/2000 | Mitsuishi |
| 6,032,268 A | 2/2000 | Swoboda et al. |
| 6,034,538 A | 3/2000 | Abramovici |
| 6,034,541 A | 3/2000 | Kopec, Jr. et al. |
| 6,035,320 A | 3/2000 | Kiriaki et al. |
| 6,037,807 A | 3/2000 | Wu et al. |
| 6,038,551 A | 3/2000 | Barlow et al. |
| 6,041,406 A | 3/2000 | Mann |
| 6,043,695 A | 3/2000 | O'Sullivan |
| 6,043,719 A | 3/2000 | Lin et al. |
| 6,049,223 A | 4/2000 | Lytle et al. |
| 6,049,225 A | 4/2000 | Huang et al. |
| 6,051,772 A | 4/2000 | Cameron et al. |
| 6,052,035 A | 4/2000 | Nolan et al. |
| 6,052,524 A | 4/2000 | Pauna |
| 6,055,584 A | 4/2000 | Bridges et al. |
| 6,057,705 A | 5/2000 | Wojewoda et al. |
| 6,058,263 A | 5/2000 | Voth |
| 6,058,452 A | 5/2000 | Rangasayee et al. |
| 6,061,511 A | 5/2000 | Marantz et al. |
| 6,066,961 A | 5/2000 | Lee et al. |
| 6,070,003 A | 5/2000 | Gove et al. |
| 6,072,334 A | 6/2000 | Chang |
| 6,072,803 A | 6/2000 | Allmond et al. |
| 6,075,941 A | 6/2000 | Itoh et al. |
| 6,079,985 A | 6/2000 | Wohl et al. |
| 6,081,140 A | 6/2000 | King |
| 6,094,730 A | 7/2000 | Lopez et al. |
| 6,097,211 A | 8/2000 | Couts-Martin et al. |
| 6,097,432 A | 8/2000 | Mead et al. |
| 6,101,457 A | 8/2000 | Barch et al. |
| 6,101,617 A | 8/2000 | Burckhartt et al. |
| 6,104,217 A | 8/2000 | Magana |
| 6,104,325 A | 8/2000 | Liaw et al. |
| 6,107,769 A | 8/2000 | Saylor et al. |
| 6,107,826 A | 8/2000 | Young et al. |
| 6,107,882 A | 8/2000 | Gabara et al. |
| 6,110,223 A | 8/2000 | Southgate et al. |
| 6,111,431 A | 8/2000 | Estrada |
| 6,112,264 A | 8/2000 | Beasley et al. |
| 6,121,791 A | 9/2000 | Abbott |
| 6,121,805 A | 9/2000 | Thamsirianunt et al. |
| 6,121,965 A | 9/2000 | Kenney et al. |
| 6,125,416 A | 9/2000 | Warren |
| 6,130,548 A | 10/2000 | Koifman |
| 6,130,551 A | 10/2000 | Agrawal et al. |
| 6,130,552 A | 10/2000 | Jefferson et al. |
| 6,133,773 A | 10/2000 | Garlepp et al. |
| 6,134,181 A | 10/2000 | Landry |
| 6,134,516 A | 10/2000 | Wang et al. |
| 6,137,308 A | 10/2000 | Nayak |
| 6,140,853 A | 10/2000 | Lo |
| 6,141,376 A | 10/2000 | Shaw |
| 6,141,764 A | 10/2000 | Ezell |
| 6,144,327 A | 11/2000 | Distinti et al. |
| 6,148,104 A | 11/2000 | Wang et al. |
| 6,148,441 A | 11/2000 | Woodward |
| 6,149,299 A | 11/2000 | Aslan et al. |
| 6,150,866 A | 11/2000 | Eto et al. |
| 6,154,055 A | 11/2000 | Cliff et al. |
| 6,154,064 A | 11/2000 | Proebsting |
| 6,157,024 A | 12/2000 | Chapdelaine et al. |
| 6,157,270 A | 12/2000 | Tso |
| 6,161,199 A | 12/2000 | Szeto et al. |
| 6,166,367 A | 12/2000 | Cho |
| 6,166,960 A | 12/2000 | Marneweck et al. |
| 6,167,077 A | 12/2000 | Ducaroir et al. |
| 6,167,364 A | 12/2000 | Stellenberg et al. |
| 6,167,559 A | 12/2000 | Furtek et al. |
| 6,169,383 B1 | 1/2001 | Sabin et al. |
| 6,172,428 B1 | 1/2001 | Jordan |
| 6,172,571 B1 | 1/2001 | Moyal et al. |
| 6,173,419 B1 | 1/2001 | Barnett |
| 6,175,914 B1 | 1/2001 | Mann |
| 6,175,949 B1 | 1/2001 | Gristede et al. |
| 6,181,163 B1 | 1/2001 | Agrawal et al. |
| 6,183,131 B1 | 2/2001 | Holloway et al. |
| 6,185,127 B1 | 2/2001 | Myers et al. |
| 6,185,450 B1 | 2/2001 | Seguine et al. |
| 6,185,522 B1 | 2/2001 | Bakker |
| 6,185,703 B1 | 2/2001 | Guddat et al. |
| 6,185,732 B1 | 2/2001 | Mann et al. |
| 6,188,228 B1 | 2/2001 | Philipp |
| 6,188,241 B1 | 2/2001 | Gauthier et al. |
| 6,188,381 B1 | 2/2001 | Van Der et al. |
| 6,188,391 B1 | 2/2001 | Seely et al. |
| 6,188,975 B1 | 2/2001 | Gay |
| 6,191,603 B1 | 2/2001 | Muradali et al. |
| 6,191,660 B1 | 2/2001 | Mar et al. |
| 6,191,998 B1 | 2/2001 | Reddy et al. |
| 6,192,431 B1 | 2/2001 | Dabral et al. |
| 6,198,303 B1 | 3/2001 | Rangasayee |
| 6,201,407 B1 | 3/2001 | Kapusta et al. |
| 6,201,829 B1 | 3/2001 | Schneider |
| 6,202,044 B1 | 3/2001 | Tzori |
| 6,204,687 B1 | 3/2001 | Schultz et al. |
| 6,205,574 B1 | 3/2001 | Dellinger et al. |
| 6,208,572 B1 | 3/2001 | Adams et al. |
| 6,211,708 B1 | 4/2001 | Klemmer |
| 6,211,715 B1 | 4/2001 | Terauchi |
| 6,211,741 B1 | 4/2001 | Dalmia |
| 6,215,352 B1 | 4/2001 | Sudo |
| 6,216,254 B1 | 4/2001 | Pesce et al. |
| 6,219,729 B1 | 4/2001 | Keats et al. |
| 6,222,528 B1 | 4/2001 | Gerpheide et al. |
| 6,223,144 B1 | 4/2001 | Barnett et al. |
| 6,223,147 B1 | 4/2001 | Bowers |
| 6,223,272 B1 | 4/2001 | Coehlo et al. |
| RE37,195 E | 5/2001 | Kean |
| 6,225,866 B1 | 5/2001 | Kubota et al. |
| 6,236,242 B1 | 5/2001 | Hedberg |
| 6,236,275 B1 | 5/2001 | Dent |
| 6,236,278 B1 | 5/2001 | Olgaard |
| 6,236,593 B1 | 5/2001 | Hong et al. |
| 6,239,389 B1 | 5/2001 | Allen et al. |
| 6,239,798 B1 | 5/2001 | Ludolph et al. |
| 6,240,375 B1 | 5/2001 | Sonoda |
| 6,243,654 B1 | 6/2001 | Johnson et al. |
| 6,246,258 B1 | 6/2001 | Lesea |
| 6,246,410 B1 | 6/2001 | Bergeron et al. |
| 6,249,167 B1 | 6/2001 | Oguchi et al. |
| 6,249,447 B1 | 6/2001 | Boylan et al. |
| 6,253,250 B1 | 6/2001 | Evans et al. |
| 6,253,754 B1 | 7/2001 | Roohparvar |
| 6,262,717 B1 | 7/2001 | Donohue et al. |
| 6,263,302 B1 | 7/2001 | Hellestrand et al. |
| 6,263,339 B1 | 7/2001 | Hirsch |
| 6,263,484 B1 | 7/2001 | Yang |
| 6,271,679 B1 | 8/2001 | Mcclintock et al. |
| 6,272,646 B1 | 8/2001 | Rangasayee et al. |
| 6,275,117 B1 | 8/2001 | Abugharbieh et al. |
| 6,278,568 B1 | 8/2001 | Cloke et al. |
| 6,280,391 B1 | 8/2001 | Olson et al. |
| 6,281,753 B1 | 8/2001 | Corsi et al. |
| 6,282,547 B1 | 8/2001 | Hirsch |
| 6,282,551 B1 | 8/2001 | Anderson et al. |

(56) References Cited

U.S. PATENT DOCUMENTS

| | | |
|---|---|---|
| 6,286,127 B1 | 9/2001 | King et al. |
| 6,288,707 B1 | 9/2001 | Philipp |
| 6,289,300 B1 | 9/2001 | Brannick et al. |
| 6,289,478 B1 | 9/2001 | Kitagaki |
| 6,289,489 B1 | 9/2001 | Bold et al. |
| 6,292,028 B1 | 9/2001 | Tomita |
| 6,294,932 B1 | 9/2001 | Watarai |
| 6,294,962 B1 | 9/2001 | Mar |
| 6,298,320 B1 | 10/2001 | Buckmaster et al. |
| 6,304,014 B1 | 10/2001 | England et al. |
| 6,304,101 B1 | 10/2001 | Nishihara |
| 6,304,790 B1 | 10/2001 | Nakamura et al. |
| 6,307,413 B1 | 10/2001 | Dalmia et al. |
| 6,310,521 B1 | 10/2001 | Dalmia |
| 6,310,568 B1 | 10/2001 | Kurooka |
| 6,310,611 B1 | 10/2001 | Caldwell |
| 6,311,149 B1 | 10/2001 | Ryan et al. |
| 6,314,530 B1 | 11/2001 | Mann |
| 6,320,184 B1 | 11/2001 | Winklhofer et al. |
| 6,320,282 B1 | 11/2001 | Caldwell |
| 6,321,369 B1 | 11/2001 | Heile et al. |
| 6,323,846 B1 | 11/2001 | Westerman et al. |
| 6,324,628 B1 | 11/2001 | Chan |
| 6,324,672 B1 | 11/2001 | Lawman et al. |
| 6,326,859 B1 | 12/2001 | Goldman et al. |
| 6,332,137 B1 | 12/2001 | Hori et al. |
| 6,332,201 B1 | 12/2001 | Chin et al. |
| 6,337,579 B1 | 1/2002 | Mochida |
| 6,338,109 B1 | 1/2002 | Snyder et al. |
| 6,339,815 B1 | 1/2002 | Feng et al. |
| 6,342,907 B1 | 1/2002 | Petty et al. |
| 6,345,383 B1 | 2/2002 | Ueki |
| 6,347,395 B1 | 2/2002 | Payne et al. |
| 6,351,789 B1 | 2/2002 | Green |
| 6,353,452 B1 | 3/2002 | Hamada et al. |
| 6,355,980 B1 | 3/2002 | Callahan |
| 6,356,862 B2 | 3/2002 | Bailey |
| 6,356,958 B1 | 3/2002 | Lin |
| 6,356,960 B1 | 3/2002 | Jones et al. |
| 6,359,950 B2 | 3/2002 | Gossmann et al. |
| 6,362,697 B1 | 3/2002 | Pulvirenti |
| 6,363,463 B1 | 3/2002 | Mattison |
| 6,366,174 B1 | 4/2002 | Berry et al. |
| 6,366,300 B1 | 4/2002 | Ohara et al. |
| 6,366,874 B1 | 4/2002 | Lee et al. |
| 6,366,878 B1 | 4/2002 | Grunert |
| 6,369,660 B1 | 4/2002 | Wei et al. |
| 6,371,878 B1 | 4/2002 | Bowen |
| 6,373,285 B1 | 4/2002 | Konishi |
| 6,373,954 B1 | 4/2002 | Malcolm, Jr. et al. |
| 6,374,370 B1 | 4/2002 | Bockhaus et al. |
| 6,374,380 B1 | 4/2002 | Bockhaus et al. |
| 6,377,009 B1 | 4/2002 | Philipp |
| 6,377,575 B1 | 4/2002 | Mullaney et al. |
| 6,377,646 B1 | 4/2002 | Sha |
| 6,380,811 B1 | 4/2002 | Zarubinsky et al. |
| 6,380,929 B1 | 4/2002 | Platt |
| 6,380,931 B1 | 4/2002 | Gillespie et al. |
| 6,384,947 B1 | 5/2002 | Ackerman et al. |
| 6,385,742 B1 | 5/2002 | Kirsch et al. |
| 6,388,109 B1 | 5/2002 | Schwarz et al. |
| 6,388,464 B1 | 5/2002 | Lacey et al. |
| 6,396,302 B2 | 5/2002 | New et al. |
| 6,396,657 B1 | 5/2002 | Suzuki |
| 6,397,232 B1 | 5/2002 | Cheng-Hung et al. |
| 6,401,230 B1 | 6/2002 | Ahanessians et al. |
| 6,404,204 B1 | 6/2002 | Farruggia et al. |
| 6,404,445 B1 | 6/2002 | Galea et al. |
| 6,407,953 B1 | 6/2002 | Cleeves |
| 6,408,432 B1 | 6/2002 | Herrmann et al. |
| 6,411,665 B1 | 6/2002 | Chan et al. |
| 6,411,974 B1 | 6/2002 | Graham et al. |
| 6,414,671 B1 | 7/2002 | Gillespie et al. |
| 6,421,698 B1 | 7/2002 | Hong |
| 6,421,817 B1 | 7/2002 | Mohan et al. |
| 6,424,175 B1 | 7/2002 | Vangal et al. |
| 6,425,109 B1 | 7/2002 | Choukalos et al. |
| 6,429,882 B1 | 8/2002 | Abdelnur et al. |
| 6,430,305 B1 | 8/2002 | Decker |
| 6,433,645 B1 | 8/2002 | Mann et al. |
| 6,434,187 B1 | 8/2002 | Beard et al. |
| 6,437,805 B1 | 8/2002 | Sojoodi et al. |
| 6,438,565 B1 | 8/2002 | Ammirato et al. |
| 6,438,735 B1 | 8/2002 | McElvain et al. |
| 6,438,738 B1 | 8/2002 | Elayda |
| 6,441,073 B1 | 8/2002 | Tanaka et al. |
| 6,445,211 B1 | 9/2002 | Saripella |
| 6,449,628 B1 | 9/2002 | Wasson |
| 6,449,755 B1 | 9/2002 | Beausang et al. |
| 6,449,761 B1 | 9/2002 | Greidinger et al. |
| 6,452,437 B1 | 9/2002 | Takeuchi et al. |
| 6,452,514 B1 | 9/2002 | Philipp |
| 6,453,175 B2 | 9/2002 | Mizell et al. |
| 6,453,461 B1 | 9/2002 | Chaiken |
| 6,456,304 B1 | 9/2002 | Angiulo et al. |
| 6,457,355 B1 | 10/2002 | Philipp |
| 6,457,479 B1 | 10/2002 | Zhuang et al. |
| 6,460,172 B1 | 10/2002 | Farre et al. |
| 6,460,175 B1 | 10/2002 | Ferri et al. |
| 6,463,488 B1 | 10/2002 | San Juan |
| 6,466,036 B1 | 10/2002 | Philipp |
| 6,466,078 B1 | 10/2002 | Stiff |
| 6,466,898 B1 | 10/2002 | Chan |
| 6,473,069 B1 | 10/2002 | Gerpheide |
| 6,473,825 B1 | 10/2002 | Worley et al. |
| 6,477,691 B1 | 11/2002 | Bergamaschi et al. |
| 6,480,921 B1 | 11/2002 | Mansoorian et al. |
| 6,483,343 B1 | 11/2002 | Faith et al. |
| 6,487,700 B1 | 11/2002 | Fukushima |
| 6,489,899 B1 | 12/2002 | Ely et al. |
| 6,490,213 B1 | 12/2002 | Mu et al. |
| 6,492,834 B1 | 12/2002 | Lytle et al. |
| 6,496,969 B2 | 12/2002 | Feng et al. |
| 6,496,971 B1 | 12/2002 | Lesea et al. |
| 6,498,720 B2 | 12/2002 | Glad |
| 6,499,134 B1 | 12/2002 | Buffet et al. |
| 6,499,359 B1 | 12/2002 | Washeleski et al. |
| 6,504,403 B2 | 1/2003 | Bangs et al. |
| 6,507,214 B1 | 1/2003 | Snyder |
| 6,507,215 B1 | 1/2003 | Piasecki et al. |
| 6,507,857 B1 | 1/2003 | Yalcinalp |
| 6,509,758 B2 | 1/2003 | Piasecki et al. |
| 6,512,395 B1 | 1/2003 | Lacey et al. |
| 6,516,428 B2 | 2/2003 | Wenzel et al. |
| 6,522,128 B1 | 2/2003 | Ely et al. |
| 6,523,416 B2 | 2/2003 | Takagi et al. |
| 6,525,593 B1 | 2/2003 | Mar |
| 6,526,556 B1 | 2/2003 | Stoica et al. |
| 6,529,791 B1 | 3/2003 | Takagi |
| 6,530,065 B1 | 3/2003 | McDonald et al. |
| 6,534,970 B1 | 3/2003 | Ely et al. |
| 6,535,061 B2 | 3/2003 | Darmawaskita et al. |
| 6,535,200 B2 | 3/2003 | Philipp |
| 6,535,946 B1 | 3/2003 | Bryant et al. |
| 6,536,028 B1 | 3/2003 | Katsioulas et al. |
| 6,539,534 B1 | 3/2003 | Bennett |
| 6,542,025 B1 | 4/2003 | Kutz et al. |
| 6,542,844 B1 | 4/2003 | Hanna |
| 6,542,845 B1 | 4/2003 | Grucci et al. |
| 6,546,297 B1 | 4/2003 | Gaston et al. |
| 6,552,933 B2 | 4/2003 | Roohparvar |
| 6,553,057 B1 | 4/2003 | Sha et al. |
| 6,554,469 B1 | 4/2003 | Thomson et al. |
| 6,556,044 B2 | 4/2003 | Langhammer et al. |
| 6,557,164 B1 | 4/2003 | Faustini |
| 6,559,685 B2 | 5/2003 | Green |
| 6,560,306 B1 | 5/2003 | Duffy et al. |
| 6,560,699 B1 | 5/2003 | Konkle |
| 6,563,391 B1 | 5/2003 | Mar |
| 6,564,179 B1 | 5/2003 | Belhaj |
| 6,564,334 B1 | 5/2003 | Zattiero et al. |
| 6,566,961 B2 | 5/2003 | Dasgupta et al. |
| 6,567,426 B1 | 5/2003 | van Hook et al. |
| 6,567,932 B2 | 5/2003 | Edwards et al. |

(56) References Cited

U.S. PATENT DOCUMENTS

| | | |
|---|---|---|
| 6,570,557 B1 | 5/2003 | Westerman et al. |
| 6,571,331 B2 | 5/2003 | Henry et al. |
| 6,571,373 B1 | 5/2003 | Devins et al. |
| 6,574,590 B1 | 6/2003 | Kershaw et al. |
| 6,574,739 B1 | 6/2003 | Kung et al. |
| 6,575,373 B1 | 6/2003 | Nakano |
| 6,577,258 B2 | 6/2003 | Ruha et al. |
| 6,578,174 B2 | 6/2003 | Zizzo |
| 6,580,329 B2 | 6/2003 | Sander |
| 6,581,191 B1 | 6/2003 | Schubert et al. |
| 6,587,093 B1 | 7/2003 | Shaw et al. |
| 6,587,995 B1 | 7/2003 | Duboc et al. |
| 6,588,004 B1 | 7/2003 | Southgate et al. |
| 6,590,422 B1 | 7/2003 | Dillon |
| 6,590,517 B1 | 7/2003 | Swanson |
| 6,590,589 B1 | 7/2003 | Sluiman et al. |
| 6,591,369 B1 | 7/2003 | Edwards et al. |
| 6,592,626 B1 | 7/2003 | Bauchot et al. |
| 6,594,796 B1 | 7/2003 | Chiang |
| 6,594,799 B1 | 7/2003 | Robertson et al. |
| 6,597,212 B1 | 7/2003 | Wang et al. |
| 6,597,824 B2 | 7/2003 | Newberg et al. |
| 6,598,178 B1 | 7/2003 | Yee et al. |
| 6,600,346 B1 | 7/2003 | Macaluso |
| 6,600,351 B2 | 7/2003 | Bisanti et al. |
| 6,600,480 B2 | 7/2003 | Natoli |
| 6,600,575 B1 | 7/2003 | Kohara |
| 6,601,189 B1 | 7/2003 | Edwards et al. |
| 6,601,236 B1 | 7/2003 | Curtis |
| 6,603,330 B1 | 8/2003 | Snyder |
| 6,603,348 B1 | 8/2003 | Preuss et al. |
| 6,604,179 B2 | 8/2003 | Volk et al. |
| 6,606,731 B1 | 8/2003 | Baum et al. |
| 6,608,472 B1 | 8/2003 | Kutz et al. |
| 6,610,936 B2 | 8/2003 | Gillespie et al. |
| 6,611,220 B1 | 8/2003 | Snyder |
| 6,611,276 B1 | 8/2003 | Muratori et al. |
| 6,611,856 B1 | 8/2003 | Liao et al. |
| 6,611,952 B1 | 8/2003 | Prakash et al. |
| 6,613,098 B1 | 9/2003 | Sorge et al. |
| 6,614,260 B1 | 9/2003 | Welch et al. |
| 6,614,320 B1 | 9/2003 | Sullam et al. |
| 6,614,374 B1 | 9/2003 | Gustavsson et al. |
| 6,614,458 B1 | 9/2003 | Lambert et al. |
| 6,615,167 B1 | 9/2003 | Devins et al. |
| 6,617,888 B2 | 9/2003 | Volk |
| 6,618,854 B1 | 9/2003 | Mann |
| 6,621,356 B2 | 9/2003 | Gotz et al. |
| 6,624,640 B2 | 9/2003 | Lund et al. |
| 6,625,765 B1 | 9/2003 | Krishnan |
| 6,628,163 B2 | 9/2003 | Dathe et al. |
| 6,628,311 B1 | 9/2003 | Fang |
| 6,631,508 B1 | 10/2003 | Williams |
| 6,634,008 B1 | 10/2003 | Dole |
| 6,634,009 B1 | 10/2003 | Molson et al. |
| 6,636,096 B2 | 10/2003 | Schaffer et al. |
| 6,636,169 B1 | 10/2003 | Distinti et al. |
| 6,637,015 B1 | 10/2003 | Ogami et al. |
| 6,639,586 B2 | 10/2003 | Gerpheide |
| 6,642,857 B1 | 11/2003 | Schediwy et al. |
| 6,643,151 B1 | 11/2003 | Nebrigic et al. |
| 6,643,810 B2 | 11/2003 | Whetsel |
| 6,649,924 B1 | 11/2003 | Philipp et al. |
| 6,650,581 B2 | 11/2003 | Hong et al. |
| 6,658,498 B1 | 12/2003 | Carney et al. |
| 6,658,633 B2 | 12/2003 | Devins et al. |
| 6,661,288 B2 | 12/2003 | Morgan et al. |
| 6,661,410 B2 | 12/2003 | Casebolt et al. |
| 6,661,724 B1 | 12/2003 | Snyder et al. |
| 6,664,978 B1 | 12/2003 | Kekic et al. |
| 6,664,991 B1 | 12/2003 | Chew et al. |
| 6,667,642 B1 | 12/2003 | Moyal |
| 6,667,740 B2 | 12/2003 | Ely et al. |
| 6,670,852 B1 | 12/2003 | Hauck |
| 6,671,869 B2 | 12/2003 | Davidson et al. |
| 6,673,308 B2 | 1/2004 | Hino et al. |
| 6,677,814 B2 | 1/2004 | Low et al. |
| 6,677,932 B1 | 1/2004 | Westerman |
| 6,678,645 B1 | 1/2004 | Rajsuman et al. |
| 6,678,877 B1 | 1/2004 | Perry et al. |
| 6,680,632 B1 | 1/2004 | Meyers et al. |
| 6,680,731 B2 | 1/2004 | Gerpheide et al. |
| 6,681,280 B1 | 1/2004 | Miyake et al. |
| 6,681,359 B1 | 1/2004 | Au et al. |
| 6,683,462 B2 | 1/2004 | Shimizu |
| 6,683,930 B1 | 1/2004 | Dalmia |
| 6,686,787 B2 | 2/2004 | Ling |
| 6,686,860 B2 | 2/2004 | Gulati et al. |
| 6,690,224 B1 | 2/2004 | Moore |
| 6,691,193 B1 | 2/2004 | Wang et al. |
| 6,691,301 B2 | 2/2004 | Bowen |
| 6,697,754 B1 | 2/2004 | Alexander |
| 6,701,340 B1 * | 3/2004 | Gorecki et al. ............... 708/801 |
| 6,701,487 B1 | 3/2004 | Ogami et al. |
| 6,701,508 B1 | 3/2004 | Bartz et al. |
| 6,703,961 B2 | 3/2004 | Mueck et al. |
| 6,704,381 B1 | 3/2004 | Moyal et al. |
| 6,704,879 B1 | 3/2004 | Parrish |
| 6,704,889 B2 | 3/2004 | Veenstra et al. |
| 6,704,893 B1 | 3/2004 | Bauwens et al. |
| 6,705,511 B1 | 3/2004 | Dames et al. |
| 6,711,226 B1 | 3/2004 | Williams et al. |
| 6,711,731 B2 | 3/2004 | Weiss |
| 6,713,897 B2 | 3/2004 | Caldwell |
| 6,714,066 B2 | 3/2004 | Gorecki et al. |
| 6,714,817 B2 | 3/2004 | Daynes et al. |
| 6,715,132 B1 | 3/2004 | Bartz et al. |
| 6,717,436 B2 | 4/2004 | Kress et al. |
| 6,717,474 B2 | 4/2004 | Chen et al. |
| 6,718,294 B1 | 4/2004 | Bortfeld |
| 6,718,520 B1 | 4/2004 | Merryman et al. |
| 6,718,533 B1 | 4/2004 | Schneider et al. |
| 6,720,876 B1 | 4/2004 | Burgess |
| 6,724,220 B1 | 4/2004 | Snyder et al. |
| 6,725,441 B1 | 4/2004 | Keller et al. |
| 6,728,900 B1 | 4/2004 | Meli |
| 6,728,902 B2 | 4/2004 | Kaiser et al. |
| 6,730,863 B1 | 5/2004 | Gerpheide et al. |
| 6,731,552 B2 | 5/2004 | Penner |
| 6,732,068 B2 | 5/2004 | Sample et al. |
| 6,732,347 B1 | 5/2004 | Camilleri et al. |
| 6,738,858 B1 | 5/2004 | Fernald et al. |
| 6,742,220 B2 | 6/2004 | Nagai et al. |
| 6,744,323 B1 | 6/2004 | Moyal et al. |
| 6,745,369 B1 | 6/2004 | May et al. |
| 6,748,569 B1 | 6/2004 | Brooke et al. |
| 6,750,852 B2 | 6/2004 | Gillespie et al. |
| 6,750,876 B1 | 6/2004 | Atsatt et al. |
| 6,750,889 B1 | 6/2004 | Livingston |
| 6,754,101 B2 | 6/2004 | Terzioglu et al. |
| 6,754,723 B2 | 6/2004 | Kato |
| 6,754,765 B1 | 6/2004 | Chang et al. |
| 6,754,849 B2 | 6/2004 | Tamura |
| 6,757,882 B2 | 6/2004 | Chen et al. |
| 6,765,407 B1 | 7/2004 | Snyder |
| 6,768,337 B2 | 7/2004 | Kohno et al. |
| 6,768,352 B2 | 7/2004 | Maher et al. |
| 6,769,622 B1 | 8/2004 | Tournemille et al. |
| 6,771,552 B2 | 8/2004 | Fujisawa |
| 6,774,644 B2 | 8/2004 | Eberlein |
| 6,781,456 B2 | 8/2004 | Pradhan |
| 6,782,068 B1 | 8/2004 | Wilson et al. |
| 6,784,821 B1 | 8/2004 | Lee |
| 6,785,881 B1 | 8/2004 | Bartz et al. |
| 6,788,116 B1 | 9/2004 | Cook et al. |
| 6,788,221 B1 | 9/2004 | Ely et al. |
| 6,788,521 B2 | 9/2004 | Nishi |
| 6,791,356 B2 | 9/2004 | Haycock et al. |
| 6,791,377 B2 | 9/2004 | Ilchmann et al. |
| 6,792,584 B1 | 9/2004 | Eneboe et al. |
| 6,798,218 B2 | 9/2004 | Kasperkovitz |
| 6,798,299 B1 | 9/2004 | Mar et al. |
| 6,799,198 B1 | 9/2004 | Huboi et al. |
| 6,806,771 B1 | 10/2004 | Hildebrant et al. |

(56) References Cited

U.S. PATENT DOCUMENTS

| | | |
|---|---|---|
| 6,806,782 B2 | 10/2004 | Motoyoshi et al. |
| 6,809,275 B1 | 10/2004 | Cheng et al. |
| 6,809,566 B1 | 10/2004 | Xin-Leblanc |
| 6,810,442 B1 | 10/2004 | Lin et al. |
| 6,815,979 B2 | 11/2004 | Ooshita |
| 6,816,544 B1 | 11/2004 | Bailey et al. |
| 6,817,005 B2 | 11/2004 | Mason et al. |
| 6,819,142 B2 | 11/2004 | Viehmann et al. |
| 6,823,282 B1 | 11/2004 | Snyder |
| 6,823,497 B2 | 11/2004 | Schubert et al. |
| 6,825,689 B1 | 11/2004 | Snyder |
| 6,825,869 B2 | 11/2004 | Bang |
| 6,828,824 B2 | 12/2004 | Betz et al. |
| 6,829,727 B1 | 12/2004 | Pawloski |
| 6,834,384 B2 | 12/2004 | Fiorella, II et al. |
| 6,836,169 B2 | 12/2004 | Richmond et al. |
| 6,839,774 B1 | 1/2005 | Ahn et al. |
| 6,842,710 B1 | 1/2005 | Gehring et al. |
| 6,847,203 B1 | 1/2005 | Conti et al. |
| 6,850,117 B2 | 2/2005 | Weber et al. |
| 6,850,554 B1 | 2/2005 | Sha et al. |
| 6,853,598 B2 | 2/2005 | Chevallier |
| 6,854,067 B1 | 2/2005 | Kutz et al. |
| 6,856,433 B2 | 2/2005 | Hatano et al. |
| 6,859,884 B1 | 2/2005 | Sullam |
| 6,862,240 B2 | 3/2005 | Burgan |
| 6,864,710 B1 | 3/2005 | Lacey et al. |
| 6,865,429 B1 | 3/2005 | Schneider et al. |
| 6,865,504 B2 | 3/2005 | Larson et al. |
| 6,868,500 B1 | 3/2005 | Kutz et al. |
| 6,871,253 B2 | 3/2005 | Greeff et al. |
| 6,871,331 B1 | 3/2005 | Bloom et al. |
| 6,873,203 B1 | 3/2005 | Paul et al. |
| 6,873,210 B2 | 3/2005 | Mulder et al. |
| 6,876,941 B2 | 4/2005 | Nightingale |
| 6,880,086 B2 | 4/2005 | Kidder et al. |
| 6,888,453 B2 | 5/2005 | Lutz et al. |
| 6,888,538 B2 | 5/2005 | Ely et al. |
| 6,892,310 B1 | 5/2005 | Kutz et al. |
| 6,892,322 B1 | 5/2005 | Snyder |
| 6,893,724 B2 | 5/2005 | Lin et al. |
| 6,894,928 B2 | 5/2005 | Owen |
| 6,895,530 B2 | 5/2005 | Moyer et al. |
| 6,897,390 B2 | 5/2005 | Caldwell et al. |
| 6,898,703 B1 | 5/2005 | Ogami et al. |
| 6,900,663 B1 | 5/2005 | Roper et al. |
| 6,901,014 B2 | 5/2005 | Son et al. |
| 6,901,563 B1 | 5/2005 | Ogami et al. |
| 6,903,402 B2 | 6/2005 | Miyazawa |
| 6,903,613 B1 | 6/2005 | Mitchell et al. |
| 6,904,570 B2 | 6/2005 | Foote et al. |
| 6,910,126 B1 | 6/2005 | Mar et al. |
| 6,911,857 B1 | 6/2005 | Stiff |
| 6,917,661 B1 | 7/2005 | Scott et al. |
| 6,922,821 B1 | 7/2005 | Nemecek |
| 6,924,668 B2 | 8/2005 | Mueller et al. |
| 6,934,674 B1 | 8/2005 | Douezy et al. |
| 6,937,075 B2 | 8/2005 | Lim et al. |
| 6,940,356 B2 | 9/2005 | McDonald, II et al. |
| 6,941,336 B1 | 9/2005 | Mar |
| 6,941,538 B2 | 9/2005 | Hwang et al. |
| 6,944,018 B2 | 9/2005 | Caldwell |
| 6,949,811 B2 | 9/2005 | Miyazawa |
| 6,949,984 B2 | 9/2005 | Siniscalchi |
| 6,950,954 B1 | 9/2005 | Sullam et al. |
| 6,950,990 B2 | 9/2005 | Rajarajan et al. |
| 6,952,778 B1 | 10/2005 | Snyder |
| 6,954,511 B2 | 10/2005 | Tachimori |
| 6,954,904 B2 | 10/2005 | White |
| 6,956,419 B1 | 10/2005 | Mann et al. |
| 6,957,180 B1 | 10/2005 | Nemecek |
| 6,957,242 B1 | 10/2005 | Snyder |
| 6,961,686 B2 | 11/2005 | Kodosky et al. |
| 6,963,233 B2 | 11/2005 | Puccio et al. |
| 6,963,908 B1 | 11/2005 | Lynch et al. |
| 6,966,039 B1 | 11/2005 | Bartz et al. |
| 6,967,511 B1 | 11/2005 | Sullam |
| 6,967,960 B1 | 11/2005 | Bross et al. |
| 6,968,346 B2 | 11/2005 | Hekmatpour |
| 6,969,978 B2 | 11/2005 | Dening |
| 6,970,844 B1 | 11/2005 | Bierenbaum |
| 6,971,004 B1 | 11/2005 | Pleis et al. |
| 6,972,597 B2 | 12/2005 | Kim |
| 6,973,400 B2 | 12/2005 | Cahill-O'Brien et al. |
| 6,975,123 B1 | 12/2005 | Malang et al. |
| 6,980,060 B2 | 12/2005 | Boerstler et al. |
| 6,981,090 B1 | 12/2005 | Kutz et al. |
| 6,983,047 B1 | 1/2006 | Chadha et al. |
| 6,988,192 B2 | 1/2006 | Snider |
| 6,996,796 B2 | 2/2006 | Sanchez et al. |
| 6,996,799 B1 | 2/2006 | Cismas et al. |
| 7,005,933 B1 | 2/2006 | Shutt |
| 7,009,444 B1 | 3/2006 | Scott |
| 7,010,773 B1 | 3/2006 | Bartz et al. |
| 7,015,735 B2 | 3/2006 | Kimura et al. |
| 7,017,145 B2 | 3/2006 | Taylor |
| 7,017,409 B2 | 3/2006 | Zielinski et al. |
| 7,020,854 B2 | 3/2006 | Killian et al. |
| 7,023,215 B2 | 4/2006 | Steenwyk |
| 7,023,257 B1 | 4/2006 | Sullam |
| 7,024,636 B2 | 4/2006 | Weed |
| 7,024,654 B2 | 4/2006 | Bersch et al. |
| 7,026,861 B2 | 4/2006 | Steenwyk |
| 7,030,513 B2 | 4/2006 | Caldwell |
| 7,030,656 B2 | 4/2006 | Lo et al. |
| 7,030,688 B2 | 4/2006 | Dosho et al. |
| 7,030,782 B2 | 4/2006 | Ely et al. |
| 7,034,603 B2 | 4/2006 | Brady et al. |
| 7,042,301 B2 | 5/2006 | Sutardja |
| 7,046,035 B2 | 5/2006 | Piasecki et al. |
| 7,047,166 B2 | 5/2006 | Dancea |
| 7,055,035 B2 | 5/2006 | Allison et al. |
| 7,058,921 B1 | 6/2006 | Hwang et al. |
| 7,073,158 B2 | 7/2006 | Mccubbrey |
| 7,076,420 B1 | 7/2006 | Snyder et al. |
| 7,079,166 B1 | 7/2006 | Hong |
| 7,086,014 B1 | 8/2006 | Bartz et al. |
| 7,088,166 B1 | 8/2006 | Reinschmidt et al. |
| 7,089,175 B1 | 8/2006 | Nemecek et al. |
| 7,091,713 B2 | 8/2006 | Erdelyi et al. |
| 7,092,980 B1 | 8/2006 | Mar et al. |
| 7,098,414 B2 | 8/2006 | Caldwell |
| 7,099,818 B1 | 8/2006 | Nemecek et al. |
| 7,100,133 B1 | 8/2006 | Meiyappan et al. |
| 7,103,108 B1 | 9/2006 | Beard |
| 7,109,978 B2 | 9/2006 | Gillespie et al. |
| 7,117,485 B2 | 10/2006 | Wilkinson et al. |
| 7,119,550 B2 | 10/2006 | Kitano et al. |
| 7,119,602 B2 | 10/2006 | Davis |
| 7,124,376 B2 | 10/2006 | Zaidi et al. |
| 7,127,630 B1 | 10/2006 | Snyder |
| 7,129,793 B2 | 10/2006 | Gramegna |
| 7,129,873 B2 | 10/2006 | Kawamura |
| 7,132,835 B1 | 11/2006 | Arcus |
| 7,133,140 B2 | 11/2006 | Lukacs et al. |
| 7,133,793 B2 | 11/2006 | Ely et al. |
| 7,133,945 B2 | 11/2006 | Lau |
| 7,138,841 B1 | 11/2006 | Li et al. |
| 7,138,868 B2 | 11/2006 | Sanchez et al. |
| 7,139,530 B2 | 11/2006 | Kusbel |
| 7,141,968 B2 | 11/2006 | Hibbs et al. |
| 7,141,987 B2 | 11/2006 | Hibbs et al. |
| 7,149,316 B1 | 12/2006 | Kutz et al. |
| 7,150,002 B1 | 12/2006 | Anderson et al. |
| 7,151,528 B2 | 12/2006 | Taylor et al. |
| 7,152,027 B2 | 12/2006 | Andrade et al. |
| 7,154,294 B2 | 12/2006 | Liu et al. |
| 7,161,936 B1 | 1/2007 | Barrass et al. |
| 7,162,410 B1 | 1/2007 | Nemecek et al. |
| 7,171,455 B1 | 1/2007 | Gupta et al. |
| 7,176,701 B2 | 2/2007 | Wachi et al. |
| 7,178,096 B2 | 2/2007 | Rangan et al. |
| 7,180,342 B1 | 2/2007 | Shutt et al. |
| 7,185,162 B1 | 2/2007 | Snyder |

(56) References Cited

U.S. PATENT DOCUMENTS

| | | |
|---|---|---|
| 7,185,321 B1 | 2/2007 | Roe et al. |
| 7,188,063 B1 | 3/2007 | Snyder |
| 7,193,901 B2 | 3/2007 | Ruby et al. |
| 7,199,783 B2 | 4/2007 | Wenstrand et al. |
| 7,200,507 B2 | 4/2007 | Chen et al. |
| 7,206,733 B1 | 4/2007 | Nemecek |
| 7,212,189 B2 | 5/2007 | Shaw et al. |
| 7,221,187 B1 | 5/2007 | Snyder et al. |
| 7,227,389 B2 | 6/2007 | Gong et al. |
| 7,236,921 B1 | 6/2007 | Nemecek et al. |
| 7,250,825 B2 | 7/2007 | Wilson et al. |
| 7,256,588 B2 | 8/2007 | Howard et al. |
| 7,265,633 B1 | 9/2007 | Stiff |
| 7,266,632 B2 | 9/2007 | Dao et al. |
| 7,266,768 B2 | 9/2007 | Ferlitsch et al. |
| 7,281,846 B2 | 10/2007 | Mcleod |
| 7,282,905 B2 | 10/2007 | Chen et al. |
| 7,283,151 B2 | 10/2007 | Nihei et al. |
| 7,283,410 B2 | 10/2007 | Hsu et al. |
| 7,287,112 B1 | 10/2007 | Pleis et al. |
| 7,288,977 B2 | 10/2007 | Stanley |
| 7,290,244 B2 | 10/2007 | Peck et al. |
| 7,295,049 B1 | 11/2007 | Moyal et al. |
| 7,298,124 B2 | 11/2007 | Kan et al. |
| 7,299,307 B1 | 11/2007 | Early et al. |
| 7,301,835 B2 | 11/2007 | Joshi et al. |
| 7,305,510 B2 | 12/2007 | Miller |
| 7,307,485 B1 | 12/2007 | Snyder et al. |
| 7,308,608 B1 | 12/2007 | Pleis et al. |
| 7,312,616 B2 | 12/2007 | Snyder |
| 7,323,879 B2 | 1/2008 | Kuo et al. |
| 7,324,380 B2 | 1/2008 | Negut et al. |
| 7,332,976 B1 | 2/2008 | Brennan |
| 7,340,693 B2 | 3/2008 | Martin et al. |
| 7,342,405 B2 | 3/2008 | Eldridge et al. |
| 7,358,714 B2 | 4/2008 | Watanabe et al. |
| 7,360,005 B2 | 4/2008 | Lin |
| 7,367,017 B2 | 4/2008 | Maddocks et al. |
| 7,373,437 B2 | 5/2008 | Seigneret et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,392,011 B1 | 6/2008 | Jacomb-Hood |
| 7,400,183 B1 | 7/2008 | Sivadasan et al. |
| 7,406,674 B1 | 7/2008 | Ogami et al. |
| 7,421,251 B2 | 9/2008 | Westwick et al. |
| 7,436,207 B2 | 10/2008 | Rogers et al. |
| 7,446,657 B2 | 11/2008 | Shaffer et al. |
| 7,461,274 B2 | 12/2008 | Merkin |
| 7,466,307 B2 | 12/2008 | Trent, Jr. et al. |
| 7,542,533 B2 | 6/2009 | Jasa et al. |
| 7,552,415 B2 | 6/2009 | Sanchez et al. |
| 7,554,847 B2 | 6/2009 | Lee |
| 7,609,178 B2 | 10/2009 | Son et al. |
| 7,613,943 B2 | 11/2009 | Bakker et al. |
| 7,616,509 B2 | 11/2009 | Qureshi et al. |
| 7,672,827 B1 | 3/2010 | Schapira et al. |
| 7,809,545 B2 | 10/2010 | Ciolfi et al. |
| 7,825,688 B1 | 11/2010 | Snyder et al. |
| 8,026,739 B2 | 9/2011 | Sullam et al. |
| 8,042,093 B1 | 10/2011 | Ogami |
| 8,176,296 B2 | 5/2012 | Snyder |
| 8,179,161 B1 | 5/2012 | Williams et al. |
| 8,358,150 B1 | 1/2013 | Snyder et al. |
| 8,487,655 B1 | 7/2013 | Kutz et al. |
| 8,555,032 B2 | 10/2013 | Snyder |
| 8,558,578 B1 | 10/2013 | Williams et al. |
| 8,736,303 B2 | 5/2014 | Snyder et al. |
| 9,143,134 B1 | 9/2015 | Kutz et al. |
| 2001/0002129 A1 | 5/2001 | Zimmerman et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Kamiewicz |
| 2001/0045861 A1 | 11/2001 | Bloodworth et al. |
| 2001/0047509 A1 | 11/2001 | Mason et al. |
| 2002/0007467 A1 | 1/2002 | Ma et al. |
| 2002/0010716 A1 | 1/2002 | Mccartney et al. |
| 2002/0016706 A1 | 2/2002 | Cooke et al. |
| 2002/0023110 A1 | 2/2002 | Fortin et al. |
| 2002/0033803 A1 | 3/2002 | Holzrichter et al. |
| 2002/0042696 A1 | 4/2002 | Garcia et al. |
| 2002/0052729 A1 | 5/2002 | Kyung et al. |
| 2002/0059543 A1 | 5/2002 | Cheng et al. |
| 2002/0063688 A1 | 5/2002 | Shaw et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0073380 A1 | 6/2002 | Cooke |
| 2002/0080186 A1 | 6/2002 | Frederiksen |
| 2002/0085020 A1 | 7/2002 | Carroll |
| 2002/0091739 A1 | 7/2002 | Ferlitsch et al. |
| 2002/0099863 A1 | 7/2002 | Comeau et al. |
| 2002/0108006 A1 | 8/2002 | Snyder |
| 2002/0109722 A1 | 8/2002 | Rogers et al. |
| 2002/0116168 A1 | 8/2002 | Kim |
| 2002/0121679 A1 | 9/2002 | Bazarjani et al. |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0144099 A1 | 10/2002 | Muro et al. |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156929 A1 | 10/2002 | Hekmatpour |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174134 A1 | 11/2002 | Goykhman |
| 2002/0174411 A1 | 11/2002 | Feng et al. |
| 2002/0188910 A1 | 12/2002 | Lizzo |
| 2002/0191029 A1 | 12/2002 | Gillespie et al. |
| 2003/0011639 A1 | 1/2003 | Webb |
| 2003/0014447 A1 | 1/2003 | White |
| 2003/0025734 A1 | 2/2003 | Boose et al. |
| 2003/0033588 A1 | 2/2003 | Alexander |
| 2003/0041235 A1 | 2/2003 | Meyer |
| 2003/0056071 A1 | 3/2003 | Triece et al. |
| 2003/0058469 A1 | 3/2003 | Buis et al. |
| 2003/0061409 A1 | 3/2003 | Rudusky |
| 2003/0061572 A1 | 3/2003 | McClannahan et al. |
| 2003/0062889 A1 | 4/2003 | Ely et al. |
| 2003/0066057 A1 | 4/2003 | RuDusky |
| 2003/0067919 A1 | 4/2003 | Qiao et al. |
| 2003/0080755 A1 | 5/2003 | Kobayashi |
| 2003/0086300 A1 | 5/2003 | Noyes et al. |
| 2003/0097640 A1 | 5/2003 | Abrams et al. |
| 2003/0105620 A1 | 6/2003 | Bowen |
| 2003/0126947 A1 | 7/2003 | Margaria |
| 2003/0135842 A1 | 7/2003 | Frey et al. |
| 2003/0149961 A1 | 8/2003 | Kawai et al. |
| 2003/0210832 A1 | 11/2003 | Benton |
| 2003/0229482 A1 | 12/2003 | Cook et al. |
| 2003/0229877 A1 | 12/2003 | Bersch et al. |
| 2004/0018711 A1 | 1/2004 | Madurawe |
| 2004/0054821 A1 | 3/2004 | Warren et al. |
| 2004/0141392 A1 | 7/2004 | Lee et al. |
| 2004/0153802 A1 | 8/2004 | Kudo et al. |
| 2004/0205553 A1 | 10/2004 | Hall et al. |
| 2004/0205617 A1 | 10/2004 | Light |
| 2004/0205695 A1 | 10/2004 | Fletcher |
| 2004/0221238 A1 | 11/2004 | Cifra et al. |
| 2005/0024341 A1 | 2/2005 | Gillespie et al. |
| 2005/0066152 A1 | 3/2005 | Garey |
| 2005/0143968 A9 | 6/2005 | Odom et al. |
| 2005/0240917 A1 | 10/2005 | Wu |
| 2005/0248534 A1 | 11/2005 | Kehlstadt |
| 2005/0280453 A1 | 12/2005 | Hsieh |
| 2006/0015862 A1 | 1/2006 | Odom et al. |
| 2006/0031768 A1 | 2/2006 | Shah et al. |
| 2006/0032680 A1 | 2/2006 | Elias et al. |

(56) References Cited

U.S. PATENT DOCUMENTS

| | | |
|---|---|---|
| 2006/0097991 A1 | 5/2006 | Hotelling et al. |
| 2006/0273804 A1 | 12/2006 | Delorme et al. |
| 2007/0139074 A1 | 6/2007 | Reblewski |
| 2007/0214389 A1 | 9/2007 | Severson et al. |
| 2007/0258458 A1 | 11/2007 | Kapoor |
| 2008/0086668 A1 | 4/2008 | Jefferson et al. |
| 2008/0095213 A1 | 4/2008 | Lin et al. |
| 2008/0158165 A1 | 7/2008 | Geaghan et al. |
| 2008/0186052 A1 | 8/2008 | Needham et al. |
| 2008/0259998 A1 | 10/2008 | Venkataraman et al. |
| 2008/0294806 A1 | 11/2008 | Swindle et al. |
| 2009/0066427 A1 | 3/2009 | Brennan |
| 2009/0322305 A1 | 12/2009 | De |
| 2012/0086471 A1 | 4/2012 | Snyder et al. |

FOREIGN PATENT DOCUMENTS

| | | |
|---|---|---|
| EP | 0308503 B1 | 3/1989 |
| EP | 0308583 A | 3/1989 |
| EP | 368398 A1 | 5/1990 |
| EP | 0369816 A | 5/1990 |
| EP | 0450863 A | 10/1991 |
| EP | 0499383 A | 8/1992 |
| EP | 0639816 A2 | 2/1995 |
| EP | 0871223 A | 10/1998 |
| EP | 1170671 A | 1/2002 |
| EP | 1191423 A | 3/2002 |
| EP | 1205848 A1 | 5/2002 |
| EP | 1713252 A | 10/2006 |
| JP | 405055842 A1 | 3/1993 |
| JP | 06021732 A1 | 1/1994 |
| JP | 404095408 A1 | 3/2002 |
| JP | 4083405 B2 | 4/2008 |
| TW | 197907 | 2/2004 |
| WO | 9532478 A | 11/1995 |
| WO | 9532481 A | 11/1995 |
| WO | 9617305 A | 6/1996 |
| WO | 9834376 A2 | 8/1998 |
| WO | 9909712 A | 2/1999 |

OTHER PUBLICATIONS

USPTO Advisory Action for U.S. Appl. No. 09/975,338 dated May 15, 2006; 4 pages.
USPTO Advisory Action for U.S. Appl. No. 11/799,439 dated Mar. 20, 2009; 3 pages.
USPTO Final Rejection for U.S. Appl. No. 09/975,338 dated Jan. 18, 2006; 12 pages.
USPTO Final Rejection for U.S. Appl. No. 09/975,338 dated Jan. 31, 2008; 21 pages.
USPTO Final Rejection for U.S. Appl. No. 09/975,338 dated Feb. 27, 2007; 23 pages.
USPTO Final Rejection for U.S. Appl. No. 10/033,027 dated Jun. 8, 2007; 8 pages.
USPTO Final Rejection for U.S. Appl. No. 10/033,027 dated Aug. 9, 2006; 6 pages.
USPTO Final Rejection for U.S. Appl. No. 10/033,027 dated Oct. 31, 2005; 24 pages.
USPTO Final Rejection for U.S. Appl. No. 11/799,439 dated Dec. 18, 2008; 6 pages.
USPTO Non Final Rejection for U.S. Appl. No. 10/033,027 dated Apr. 20, 2005; 20 pages.
USPTO Non Final Rejection for U.S. Appl. No. 10/033,027 dated Oct. 18, 2004; 17 pages.
USPTO Non-Final Rejection for U.S. Appl. No. 09/975,338 dated Apr. 30, 2010; 10 pages.
USPTO Non-Final Rejection for U.S. Appl. No. 09/975,338 dated Aug. 14, 2007; 19 pages.
USPTO Non-Final Rejection for U.S. Appl. No. 09/975,338 dated Sep. 6, 2006; 11 pages.
USPTO Non-Final Rejection for U.S. Appl. No. 10/033,027 dated Mar. 15, 2011; 6 pages.
USPTO Non-Final Rejection for U.S. Appl. No. 10/033,027 dated Apr. 26, 2006; 26 pages.
USPTO Non-Final Rejection for U.S. Appl. No. 10/033,027 dated Dec. 18, 2008; 5 pages.
USPTO Non-Final Rejection for U.S. Appl. No. 10/033,027 dated Dec. 21, 2006; 31 pages.
USPTO Non-Final Rejection for U.S. Appl. No. 11/799,439 dated May 29, 2008; 8 pages.
USPTO Non-Final Rejection for U.S. Appl. No. 11/799,439 dated Nov. 2, 2007; 7 pages.
USPTO Non-Final Rejection for U.S. Appl. No. 09/975,338 dated Apr. 5, 2005; 13 pages.
USPTO Notice of Allowance for U.S. Appl. No. 10/033,027 dated Feb. 18, 2010; 4 pages.
USPTO Notice of Allowance for U.S. Appl. No. 10/033,027 dated Mar. 31, 2009; 7 pages.
USPTO Notice of Allowance for U.S. Appl. No. 10/033,027 dated Jun. 29, 2010; 4 pages.
USPTO Notice of Allowance for U.S. Appl. No. 10/033,027 dated Aug. 18, 2011; 5 pages.
USPTO Notice of Allowance for U.S. Appl. No. 10/033,027 dated Sep. 2, 2009; 4 pages.
USPTO Notice of Allowance for U.S. Appl. No. 10/033,027 dated Oct. 15, 2010; 4 pages.
USPTO Notice of Allowance for U.S. Appl. No. 10/033,027 dated Dec. 13, 2011; 5 pages.
USPTO Notice of Allowance for U.S. Appl. No. 11/799,439 dated Feb. 5, 2010; 4 pages.
USPTO Notice of Allowance for U.S. Appl. No. 11/799,439 dated Jun. 1, 2010; 4 pages.
USPTO Notice of Allowance for U.S. Appl. No. 11/799,439 dated Jun. 25, 2009; 6 pages.
USPTO Notice of Allowance for U.S. Appl. No. 11/799,439 dated Sep. 13, 2010; 4 pages.
USPTO Notice of Allowance for U.S. Appl. No. 11/799,439 dated Oct. 13, 2009; 4 pages.
USPTO Notice of Allowance for U.S. Appl. No. 12/902,137 dated Feb. 27, 2012; 5 pages.
USPTO Notice of Allowance for U.S. Appl. No. 12/902,137 dated Mar. 30, 2012; 5 pages.
USPTO Notice of Allowance for U.S. Appl. No. 12/902,137 dated Jun. 8, 2012; 5 pages.
USPTO Notice of Allowance for U.S. Appl. No. 12/902,137 dated Aug. 8, 2012; 7 pages.
USPTO Notice of Allowance for U.S. Appl. No. 12/902,137 dated Sep. 19, 2012; 6 pages.
USPTO Notice of Allowance for U.S. Appl. No. 12/902,137 dated Oct. 26, 2012; 5 pages.
USPTO Notice of Allowance for U.S. Appl. No. 12/902,137 dated Dec. 7, 2011; 5 pages.
Dahl et al., "Emulation of the Sparcle Microprocessor with the MIT Virtual Wires Emulation System," 1994, IEEE, pp. 14-22; 9 pages.
Fasang. P.P. et al., Design for Testability for Mixed Analog/Digital ASICs, 1988, IEEE. 4 pages.
Milor, Linda S., A Tutorial Introduction to Research on Analog and Mixed-Signal Circuit Testing., 1998, IEEE, 19 pages.
USPTO Final Rejection for U.S. Appl. No. 13/328,385 dated Jul. 2, 2013; 5 pages.
USPTO Non Final Rejection for U.S. Appl. No. 13/328,385 dated Apr. 2, 2013; 8 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Non-Final Rejection for U.S. Appl. No. 09/924,734 dated May 8, 2002; 6 pages.
USPTO Non-Final Rejection for U.S. Appl. No. 09/924,734 dated Jun. 11, 2003; 7 pages.

(56) References Cited

OTHER PUBLICATIONS

USPTO Non-Final Rejection for U.S. Appl. No. 10/803,030 dated Jun. 8, 2005; 4 pages.
USPTO Non-Final Rejection for U.S. Appl. No. 12/902,137 dated Mar. 11, 2011; 9 pages.
USPTO Non-Final Rejection for U.S. Appl. No. 13/169,656 dated Sep. 13, 2012; 11 pages.
USPTO Notice of Allowance for U.S. Appl. No. 09/893,048 dated Jul. 25, 2006; 4 pages.
USPTO Notice of Allowance for U.S. Appl. No. 09/924,734 dated Jan. 31, 2003; 6 pages.
USPTO Notice of Allowance for U.S. Appl. No. 10/803,030 dated Jan. 8, 2007; 6 pages.
USPTO Notice of Allowance for U.S. Appl. No. 12/902,137 dated Aug. 5, 2011; 7 pages.
USPTO Notice of Allowance for U.S. Appl. No. 13/169,656 dated Jan. 17, 2013; 7 pages.
USPTO Notice of Allowance for U.S. Appl. No. 13/328,385 dated Sep. 23, 2013; 8 pages.
USPTO Notice of Allowance for U.S. Appl. No. 13/966,028 dated Jun. 17, 2015; 9 pages.
USPTO Notice of Allowance for U.S. Appl. No. 09/924,734 dated Nov. 17, 2003; 6 pages.
USPTO Non-Final Rejection for U.S. Appl. No. 14/976,580 dated May 16, 2016; 6 pages.
Atmel Corporation: AT9OSC Summary: "Secure Microcontrollers for Smart Cards," Oct. 1999; 7 pages.
Duvvuru et al., "Evaluation of a Branch Target Address Cache," 1995, IEEE, pp. 173-180; 8 pages.
Karayiannis et al., "Using XML for Representation and Visualization of Elaborated VHDL-AMS Models," Oct. 2000, IEEE, VHDL International Users Forum Fall Workshop, Proceedings, pp. 83-87.
Miguel, "Implementation of a Universal Boot Monitor for an ARM-Based System," May 2005, TU Berlin, Germany, Thesis, Chapter 4: pp. 53-100.
Texas Instruments, "TXS320C6000 Optimizing Compiler User's Guide," Apr. 2001, Texas Instruments, Chapter 1: pp. 1-7 and Chapter 2: pp. 1-44.
Yahoo Answers:, "What is the meaning of cascade connection in electrical engineering?" retrieved on Aug. 7, 2015 from https://answers.yahoo.com/question/index?, 1 page.
USPTO Non-Final Rejection for U.S. Appl. No. 13/211,329 dated Feb. 24, 2017; 13 pages.
USPTO Non-Final Rejection for U.S. Appl. No. 13/211,329 dated Oct. 5, 2016; 13 pages.
USPTO Notice of Allowance for U.S. Appl. No. 14/866,439 dated Jan. 23, 2017; 8 pages.
USPTO Notice of Allowance for U.S. Appl. No. 14/866,439 dated Jun. 1, 2017; 5 pages.
USPTO Notice of Allowance for U.S. Appl. No. 14/976,580 dated Mar. 15, 2017; 5 pages.
USPTO Notice of Allowance for U.S. Appl. No. 14/976,580 dated Nov. 30, 2016; 5 pages.
U.S. Appl. No. 11/322,044, dated Dec. 28, 2005, Stiff, Jonathon.
USPTO Advisory Action for U.S. Appl. No. 09/998,848 dated Feb. 24, 2010; 3 pages.
USPTO Advisory Action for U.S. Appl. No. 09/998,848 dated Sep. 7, 2005; 3 pages.
USPTO Advisory Action for U.S. Appl. No. 13/211,329 dated Jan. 15, 2015; 2 pages.
USPTO Advisory Action for U.S. Appl. No. 13/211,329 dated May 1, 2014; 2 pages.
USPTO Advisory Action for U.S. Appl. No. 13/211,329 dated Aug. 8, 2016; 2 pages.
USPTO Advisory Action for U.S. Appl. No. 13/211,329 dated Oct. 29, 2015; 3 pages.
USPTO Final Rejection for U.S. Appl. No. 09/998,848 dated Jun. 14, 2005; 17 pages.
USPTO Final Rejection for U.S. Appl. No. 09/998,848 dated Jul. 25, 2006; 16 pages.
USPTO Final Rejection for U.S. Appl. No. 09/998,848 dated Aug. 10, 2007; 14 pages.
USPTO Final Rejection for U.S. Appl. No. 09/998,848 dated Nov. 24, 2008; 15 pages.
USPTO Final Rejection for U.S. Appl. No. 09/998,848 dated Dec. 10, 2009; 16 pages.
USPTO Final Rejection for U.S. Appl. No. 11/818,005 dated May 24, 2010; 8 pages.
USPTO Final Rejection for U.S. Appl. No. 13/211,329 dated Feb. 11, 2014; 11 pages.
USPTO Final Rejection for U.S. Appl. No. 13/211,329 dated May 19, 2016; 11 pages.
USPTO Final Rejection for U.S. Appl. No. 13/211,329 dated Aug. 13, 2015; 11 pages.
USPTO Final Rejection for U.S. Appl. No. 13/211/329 dated Oct. 27, 2014; 11 pages.
USPTO Non-Final Rejection for U.S. Appl. No. 09/998,848 dated Jan. 26, 2006; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Feb. 22, 2008; 15 pages.
USPTO Non-Final Rejection for U.S. Appl. No. 09/998,848 dated May 12, 2009; 16 pages.
USPTO Non-Final Rejection for U.S. Appl. No. 09/998,848 dated Jun. 21, 2010; 15 pages.
USPTO Non-Final Rejection for U.S. Appl. No. 09/998,848 dated Dec. 21, 2004; 14 pages.
USPTO Non-Final Rejection for U.S. Appl. No. 13/211,329 dated Jan. 14, 2016; 10 pages.
USPTO Non-Final Rejection for U.S. Appl. No. 13/211,329 dated Mar. 26, 2015; 10 pages.
USPTO Non-Final Rejection for U.S. Appl. No. 13/211,329 dated Jun. 19, 2014; 12 pages.
USPTO Non-Final Rejection for U.S. Appl. No. 13/211,329 dated Oct. 7, 2013; 7 pages.
USPTO Notice of Allowance for U.S. Appl. No. 09/924,734 dated Feb. 5, 2003; 4 pages.
USPTO Notice of Allowance for U.S. Appl. No. 09/998,848 dated Feb. 17, 2011; 7 pages.
USPTO Notice of Allowance for U.S. Appl. No. 09/998,848 dated Jun. 10, 2011; 8 pages.
USPTO Notice of Allowance for U.S. Appl. No. 09/998,848 dated Oct. 13, 2010; 4 pages.
USPTO Notice of Allowance for U.S. Appl. No. 13/169,656 dated Mar. 25, 2013; 6 pages.
USPTO Notice of Allowance for U.S. Appl. No. 13/169,656 dated Jul. 9, 2013; 9 pages.
USPTO Notice of Allowance for U.S. Appl. No. 13/328,385 dated Jan. 17, 2014; 5 pages.
USPTO Notice of Allowance for U.S. Appl. No. 13/328,385 dated Nov. 18, 2013; 7 pages.
USPTO Notice of Allowance for U.S. Appl. No. 14/976,580 dated Jun. 27, 2017; 5 pages.
USPTO Notice of Allowance for U.S. Appl. No. 14/976,580 dated Aug. 17, 2016; 8 pages.
"An Analog PPL-Based Clock and Data Recovery Circuit with High Input Jitter Tolerance;" Sun, Reprinted from IEEE Journal of Solid-State Circuits, 1989; 4 pages.
"Electronic Circuit Protector-Circuit Breaker;" IBM Technical Disclosure Bulletin; vol. 36, Issue 8, Aug. 1, 1993; 1 page.
"PSoC Designer: Integrated Development Environment User Guide"; Jul. 17, 2001; Cypress MicroSystems; Revision 1.11; all pages.
"PSoC designer: Integrated development environment, getting started 25-minute tutorial, version 1.0," Cypress Microsystems., Cypress Microsystems, Inc. CMS10006A, Jul. 3, 2001; 25 pages.
"PSoC technology complete changes 8-bit MCU system design", Cypress Microsystems, Inc. retrieved from <http>://www.archive.org/web/20010219005250/http://cypressmicro.com-/t . . . >, Feb. 19, 2001; 21 pages.

(56) References Cited

OTHER PUBLICATIONS

Andrews, "Roadmap for Extending IEEE 1149.1 for Hierarchical Control of Locally-Stored, Standardized command Set, Test Programs," IEEE, 1994; 7 pages.
Ashok Bindra, "Programmable SoC Delivers a New Level of System Flexibility"; Electronic Design; Nov. 6, 2000; 11 pages.
Azim et al., "A Custom DSP Chip to Implement a Robot Motion Controller Proceedings of the IEEE Custom Integrated Circuits Conference," May 1988, pp. 8.7.1-8.7.5; 6 pages.
Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
Ching et al., "An In-Curcuit-Emulator for TMS320C25," IEEE, 1994, pp. 51-56; 6 pages.
Cypress MicroSystem, Inc. "Cypress Customer Forums" retrieved from <http://www.cypress.com/forums/messageview; Nov. 30, 2004; 1 page.
Cypress MicroSystem, Inc. "PsoC Designer: Integrated Development Environment User Guide"; Rev. 1.18; Sep. 8, 2003; 193 pages.
Cypress MicroSystems, Inc. "Cypress MicroSystems Unveils Programmable System-On-A-Chip for Embedded Internet, Communications, and Consumer Systems" Nov. 13, 2000; 3 pages.
Dirk Killat, "A One-Chip Solution for Electronic Ballasts in Fluorescent Lamps," Power Electronics, http://powerelectronics.com/mag/power_onechip_solution_electronic/, dated Mar. 1, 2004, accessed Sep. 13, 2005; 4 pages.
Durham et al., "Circuit Architectures for High Linearity Monolithic Continuous-Time Filtering," IEEE, 1992; 7 pages.
Durham et al., "High-Linearity CoinTnuous-Time Filter in 5-V VLSI CMOS," IEEE, 1992; 8 pages.
Durham et al., "Integrated Continuous-Time Balanced Filters for 16-bit DSP Interfaces," IEEE, 1993; 6 pages.
Ebeling et al., "Validating VLSI Circuit Layout by Wirelist Comparison," Sep. 1983, In the Proceedings of the IEEE International Conference on Computer Aided Design (ICCAD-83), pp. 172-173; 2 pages.
Ebling, "Gemini II: A Second Generation Layout Validation Program;" 1988; in proceedings of the IEEE International Conference on Computer Aided Design (ICCAD-88); 4 pages.
Frank Goodenough, "Analog Counterparts of FPGAS Ease System Design," Electronic Design, Penton Publishing, Cleveland, OH, Oct. 14, 1994, vol. 42, No. 21, pp. 63-66, 68; 10 pages.
Fred Eady, "PSoC 101," Circuit Cellar, Aug. 2004, accessed Sep. 13, 2005, http://www.circuitcellar.com/library/print/0804/eady169/2.htm; 4 pages.
Haberl et al., "Self Testable Boards with Standard IEEE 1149.5 Module Test and Maintenance (MTM) Bus Interface," IEEE, 1994; 6 pages.
Hamblen, "Rapid Prototyping Using Field-Programmable Logic Devices" Jun. 2000, IEEE; 9 pages.
Hintz et al., "Microcontrollers," 1992, McGraw-Hill, pp. 29-37; 11 pages.
John Mangino, "Using DMA with High Performance Peripherals to Maximize System Performance," 2007, Texas Instruments, pp. 1-23; 23 pages.
Khan et al.; "FPGA Architectures for Asic Hardware Emulators"; IEEE 1993, pp. 336-340; 5 pages.
M. Mooris Mano, "Computer System Architecture," 1982, Prentice-Hall, 2nd Edition, pp. 261-264 and 435-440; 14 pages.
Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Pastermak et al.; "In-Circuit-Emulation in ASIC Architecture Core Designs," IEEE, 1989, pp. P6-4.1- P6-4.4; 4 pages.
Robert A. Blauschild, "WP 3.5: An Integrated Time Reference," ISSCC94/Session 3, Analog Techniques/Paper WP 3.5, Feb. 1994, pp. 56-58; 4 pages.
Robinson, Gordon D., 'Why 1149.1 (JTAG) Really Works, May 1994, Conference Proceedings Electro/94 International, May 10-12, 1994, Combined Volumes, pp. 749-754; 6 pages.
Sedra, Adel S. et al., "Microelectronic Circuits," 3rd Edition, Oxford University Press, pp. xiii-xx and 861-883, 1991; 20 pages.
Stephen Walters, "Computer-Aided Prototyping for ASIC-Based Systems," 1991, IEEE Design & Test of Computers, vol. 8, Issue 2, pp. 4-10; 8 pages.
Xerox, "Mesa Debugger Documentation," Apr. 1979; Xerox Systems Development Department; Version 5.0, pp. 1-30; 33 pages.
USPTO Final Rejection for U.S. Appl. No. 13/211,329, dated Jun. 28, 2017; 15 pages.
USPTO Non-Final Rejection for U.S. Appl. No. 15/453,492, dated Sep. 22, 2017; 12 pages.
USPTO Non-Final Rejection for U.S. Appl. No. 15/455,393, dated Sep. 21, 2017; 11 pages.

\* cited by examiner

PSOC ARCHITECTURE

RELATED APPLICATIONS

This application is a continuation of U.S. application Ser. No. 13/328,385, filed Dec. 16, 2011, which is a continuation of U.S. application Ser. No. 12/902,137, filed Oct. 11, 2010, now U.S. Pat. No. 8,358,150, issued Jan. 22, 2013, which is a continuation of U.S. application Ser. No. 11/799,439, filed Apr. 30, 2007 now U.S. Pat. No. 7,825,688, issued Nov. 2, 2010, which is a continuation of U.S. application Ser. No. 10/803,030, filed Mar. 16, 2004, now U.S. Pat. No. 7,221,187, issued May 22, 2007, which is a continuation of U.S. application Ser. No. 09/924,734, filed Aug. 7, 2001, now U.S. Pat. No. 6,724,220, issued Apr. 20, 2004, which claims priority from U.S. Provisional Patent Application No. 60/243,708, filed Oct. 26, 2000, all of which are incorporated herein by reference in their entirety.

FIELD OF THE INVENTION

The present invention relates to the field of microcontrollers. More particularly, the present invention relates to the integration of programmable analog circuits and programmable digital circuits on a single semiconductor chip.

RELATED ART

Microcontrollers may have embedded processors, memories and special function analog and digital circuits. Typical analog circuits found in prior art microcontrollers include Continuous Time (CT) amplifiers having preset functions with given functional parameters. For instance, a CT analog amplifier might be configured as a fixed function circuit, such as a voltage amplifier, in which certain parameters, such as gain or bandwidth might be altered by programming.

Switched Capacitor (SC) analog circuits are also frequently incorporated into microcontroller designs. SC analog circuits in prior art are somewhat more versatile than CT analog circuits in that it might be possible to alter both the circuit function as well as the parameters of the circuit function by programming. However, both CT and SC analog circuits found in current microcontrollers generally require programming before utilization, and neither can be dynamically programmed (programmed "on-the-fly").

In the conventional art, general purpose digital circuits are frequently included in a microcontroller implementation. Such digital circuits are pre-programmed to realize certain digital functions such as logical operations, arithmetical functions, counting, etc. These digital circuits are generally in the form of Programmed Logic Array (PLA) or FPGA. Furthermore, such digital circuits that require pre-programming are generally not dynamically programmable (programmable "on-the-fly"). The main difficulty here is in the generality of such a digital circuit, which requires an excessive amount of digital logic, which in turn occupies a large area on a semiconductor chip as well as an increased cost of manufacturing.

Several other design considerations, related to microcontroller utilization either go unaddressed, or require separate functionalities to enable them. For instance, existing designs do not offer a programmable analog circuit array with both CT analog circuits and SC analog circuits on the same semiconductor chip with a programmable array of digital circuits. As a result, realization of a function requiring complex communication between analog circuits and digital circuits often requires the use of multiple semiconductor chips. Further, existing microcontroller realizations generally require pre-programming and cannot be dynamically programmed.

What is needed is a method and/or system which can be dynamically programmed to complete a complex communication interface between analog circuits and digital circuits in order to realize a desired microcontroller circuit function. What is also needed is a method and/or system that can utilize both CT and SC analog circuits implemented along with digital circuits on a single semiconductor chip. Further, what is needed is a method and/or system in which the functions and/or function parameters of the analog circuits and the digital circuits can be reconfigured by dynamic programming (programming "on-the-fly"). Further still, what is needed is a circuit and/or system in which a reduction of the digital logic implemented to realize a dynamically programmable digital circuit results in a reduction in required semiconductor chip area.

SUMMARY OF THE INVENTION

Accordingly, the present invention provides a microcontroller comprising programmable analog blocks and programmable digital blocks interconnected with a programmable interconnect structure fabricated on a single semiconductor chip. Programmable system On-a-Chip (PSoC) architecture offers an excellent analog and digital interface that solves many design needs. The present design provides the complex communication interface between digital and analog blocks that can be reconfigured on-the-fly. The programmable analog array with both Continuous Time (CT) analog blocks and Switched Capacitor (SC) analog blocks are realized on the same semiconductor chip with programmable digital blocks.

A microcontroller with analog/digital Programmable System On-a-Chip (PSoC) architecture including multiple digital PSoC blocks and multiple analog PSoC blocks in the communication array having a programmable interconnect structure is described. The single chip design is implemented by integration of programmable digital and analog circuit blocks that are able to communicate with each other. Robust analog and digital blocks that are flash memory programmable can be utilized to realize complex design applications that otherwise would require multiple chips and/or separate applications. The PSoC architecture includes a novel array having programmable digital blocks that can communicate with programmable analog blocks using a programmable interconnect structure. The programmable analog array contains a complement of Continuous Time (CT) blocks and a complement of Switched Capacitor (SC) blocks that can communicate together. The analog blocks consist of multi-blocks that can communicate together. The analog blocks consist of multi-function circuits programmable for one or more different analog functions, and fixed function circuits programmable for a fixed function with variable parameters. The digital blocks include standard multi-function circuits and enhanced circuits having functions not included in the standard digital circuits. The PSoC array is programmed by flash memory and programming allows dynamic reconfiguration. This is, "on-the-fly" reconfiguration of the PSoC blocks is allowed. The programmable analog array with both Continuous Time analog blocks and Switched Capacitor analog blocks are offered on a single chip along the programmable digital blocks. The programmable interconnect structure provided for communication of input/output data between all analog and digital blocks.

More specifically, a first embodiment of the present invention includes a number of programmable analog circuit blocks configured to provide various analog functions, and a number of programmable digital circuit blocks configured to provide various digital functions. A programmable interconnect structure comprising a routing matrix and an independent bus provided coupling between analog circuit blocks, digital circuit blocks and external devices. Flash memory is used to program the interconnect structure as well as the analog circuit blocks and the digital circuit blocks. Programming can be accomplished dynamically to reconfigure any of the programmable blocks or the interconnect structure.

A complement of Continuous Time (CT) analog circuit blocks and a complement of Switched Capacitor (SC) analog circuit blocks are configured to communicate with one another as well as with external devices by means of the interconnect structure. Dynamic or "on-the-fly" programming of the interconnect structure is used to direct data between both analog circuit blocks and digital circuit blocks as well as any external devices coupled to the semiconductor chip. A number of the analog circuit blocks are multi-function circuits that can be reconfigured by dynamic programming ("on-the-fly" programming) to perform a number of differing functions. Some of the analog circuit blocks are capable to only a single function, but dynamic or "on-the-fly" programming can reconfigure the parameters of the function. Standard digital circuit blocks are configured to perform various digital operations including logical decisions and arithmetical computations. Enhanced digital circuit blocks are configured similarly to the standard digital circuit blocks and have additional digital functions available. Both standard and enhanced digital circuit blocks are reconfigurable by dynamic or "on-the-fly" programming.

DETAILED DESCRIPTION OF THE INVENTION

Figure 1:
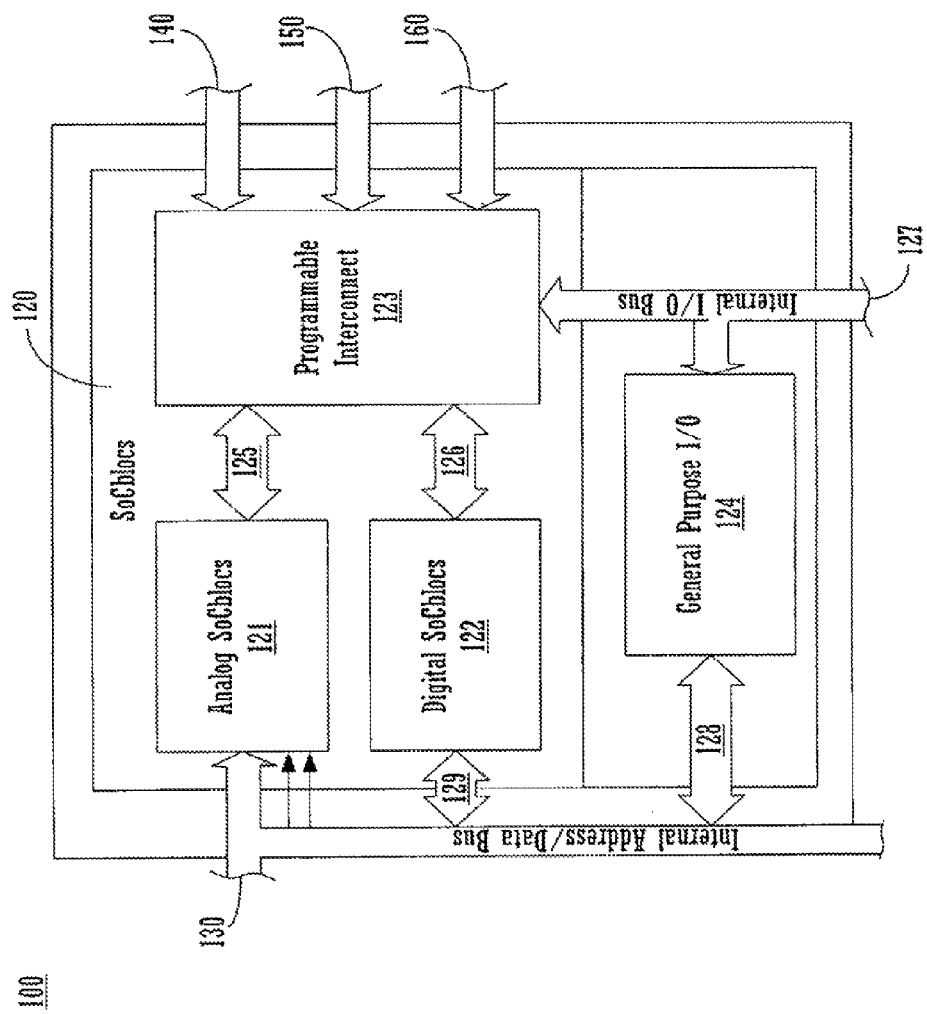
FIG. 1 is a block diagram illustrating the architecture of the Programmable System On-a-Chip (PsoC) according to the present invention.

Reference will now be made in detail to the preferred embodiments of the invention, PSoC architecture (mixed analog/digital), examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Notation and Nomenclature

Some portions of the detailed descriptions which follow may be presented in terms of procedures, logic blocks, processing, and other symbolic representations of operations on data bits within a microcontroller, or other electronic device. These descriptions and representations are used by those skilled in the electronic arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical, electronic, or magnetic signals capable of being stored, transferred, combined, compared, and otherwise manipulated in an electronic system. It has proven convenient at times, principally for reasons of common usage, to refer to these signals as bits, bytes, values, elements, symbols, characters, terms, numbers, streams, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "adjusting," "ascertaining," "calculating," "changing," "commanding," "communicating," "conducting," "controlling," "determining," "dividing," "executing," "forming," "generating," "intercommunicating," "monitoring," "multiplexing," "performing," "programming," "registering," "repeating," "sensing," "setting," "supplying," or the like, refer to the action and processes of microcontrollers, or similar intelligent electronic and/or microelectronic devices, that manipulate(s) and transform(s) data and signal represented as physical (electronic and electrical) quantities within the devices' registers and subcomponents into other data and signals similarly represented as physical quantities within the device subcomponents and registers and other such information storage, transmission or displays capabilities.

Exemplary Circuits and Systems

Exemplary Microcontroller

The present invention provides an on-chip integration of programmable digital and analog circuit blocks in a microcontroller that are able to communicate with each other. FIG. 1 is a block diagram 100 illustrating the Programmable System On-a-Chip (PSoC) architecture composed of programmable analog blocks 121 that can communicate with programmable digital blocks 122 by means of a programmable interconnect structure 123 and a General Purpose I/O 124. This novel architecture allows a single chip solution to numerous complex activities that would otherwise require multiple chips or separate applications. The dashed line 120 encloses the four major components 121, 122, 123 and 124 constructed on the single semiconductor chip. An important aspect of the present invention is the integration of both programmable analog circuits and programmable digital circuits on the same semiconductor chip.

The Analog System on a Chip Block (SoCbloc) 121 is coupled 125 to the Programmable interconnect 124, and it is also coupled to the Internal Address/Data Bus 130. In one embodiment of the present invention, the Analog SoCbloc 121 consists of four Analog Continuous Time (ACT) amplifiers, four type 1 Switched Capacitor (SC1) amplifiers and four type 2 Switched Capacitor (SC2) amplifiers, all of which are dynamically programmable. Dynamic programming allows for "on-the-fly" modification of analog amplifier fixed function parameters such as gain, bandwidth and frequency response. In addition, dynamic programming can be used to change the function of certain analog amplifiers, such as causing an amplifier function to change from simple voltage amplification to digital-to-analog conversion.

The Digital SoCbloc 122 is coupled 126 to the programmable Interconnect 124 and it is also coupled 129 to the Internal Address/Data Bus 130. In one embodiment of the present invention, the Digital SoCbloc 122 consists of four Standard Multi-Function (MFBe) digital circuits and four Enhanced Multi-Function (MFBe) digital circuits, all of which are dynamically programmable. Dynamic programming allows for "on-the-fly" modification of digital circuit parameters as well as functions. For instance, programming a digital circuit to perform a logical operation, and reprogramming at a later time to perform a digital counting operation.

The Programmable Interconnect 123 is dynamically programmable and can be used to couple any analog amplifier to any digital circuit. The Programmable Interconnect 123 is also used to route data between the Internal I/O Bus 127 and the Internal Address/Data Bus 130 as well as the General Purpose I/O unit 124 which is coupled 128 to the Internal Address/Data Bus 134. Analog Clock signals 140, Interrupt Controller signals 150 and System Clock signals 160 are connected via the Programmable Interconnect 123 for signal routing as well as dynamic programming of Analog SoCblocks 121 and Digital SoCblocs 122.

Exemplary Hardware Routing Resources

Figure 2:
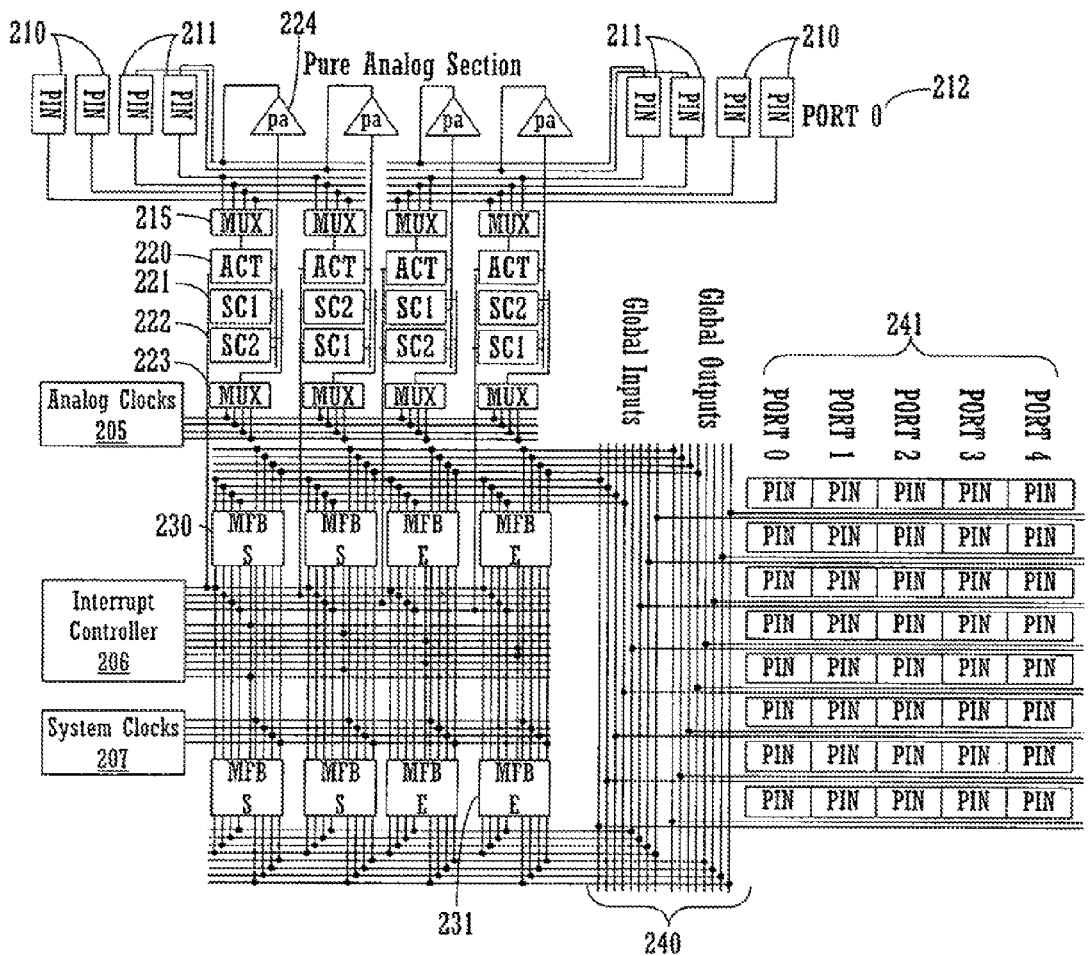
FIG. 2 illustrates one embodiment of the hardware routing resources of the Programmable System On-a-Chip (PsoC) architecture according to the present invention.

FIG. 2 illustrates one embodiment of the hardware routing resources 200 of the Programmable System On-a-Chip (PsoC) architecture according to the present invention. Twelve analog amplifier circuits, four ACT circuits 220, four SCI circuits 221 and four SC2 circuits 222, correspond to the Analog SoCblocs 121 illustrated in FIG. 1. Analog signals are coupled to the semiconductor chip at port 0, 212, which consists of four input pins 210 and four output pins 211.

An analog signal is coupled between port 0, 212, via a MUX 215 to an analog amplifier ACT 220, SCI, 221 or SC2, 222. These four MUX circuits 215 are contained within the Programmable Interrupt 123 illustrated in FIG. 1. An analog output signal from an analog amplifier ACT 220, SC1, 221 or SC2, 222 can be coupled through a power amplifier pa 224 are contained within the General Purpose I/O 124 illustrated in FIG. 1.

The Analog Clocks 205 controlling MUX 223 and MUX 215 provide analog signal routing to interconnect numerous combinations of ACT 220, and SC1, 221 and SC2, 222 analog amplifier circuits. The four MUX circuits 223 are also contained within the Programmable Interrupt 123 illustrated in FIG. 1. Various interconnect combinations can be used to realize numerous complex analog functions, such as signal amplification, signal filtering, signal filter parameters such as the number and location of poles, and so on.

The analog output signal from any amplifier ACT 220, SC1, 221 or SC2, 222 is also made available as an input to any one of eight digital circuits, four MFBs 230 and four MFBe 231, under control of Interrupt Controller 206. These eight digital circuits correspond to the Digital SoCblocs 122 illustrated in FIG. 1. Similarly, a digital output from any one of the eight digital circuits, four MFBs 230 and four MFBe 231, can be presented under control of the Interrupt Controller 206 as an input to any one of the twelve analog amplifiers ACT 220, SC1, 221 or SC2, 222.

The Interrupt Controller 206 and the System Clocks 207 couple digital signals between any one of the eight digital circuits, four MFBs 230 and four MFBe 231, and the Internal I/O Bus 240 which is illustrated 127 in FIG. 1. Digital signals are coupled to the semiconductor chip by means of forty (40) individual pins which form ports 0 through 4, 241.

Exemplary Digital/Analog Function

Figure 3:
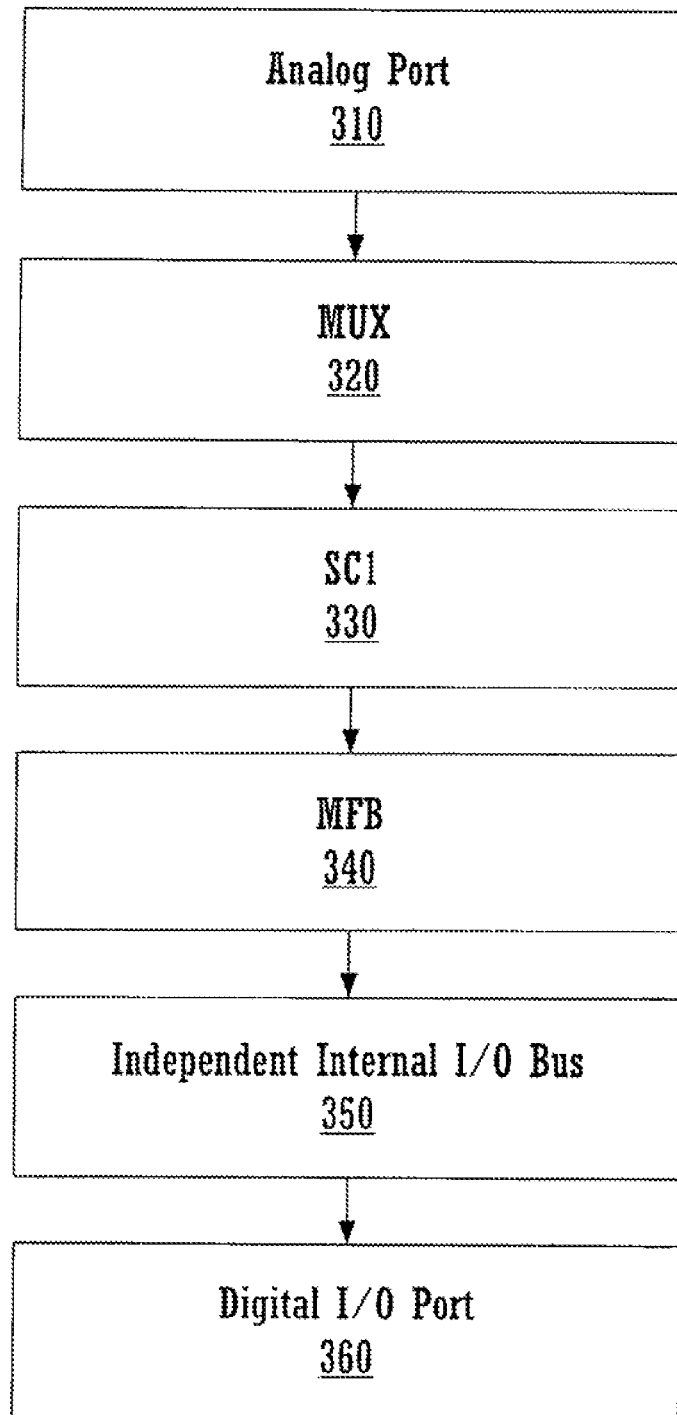
FIG. 3 is a flow chart illustrating steps in a combined digital/analog operation possible with the Programmable System On-a-Chip (PsoC) according to the present invention.

FIG. 3 is a flow chart illustrating steps 300 in a combined analog/digital operation possible with the Programmable System On-a-Chip (PsoC) according to the present invention. Component reference numbers used are as assigned in FIG. 2. An analog signal to be digitized is presented in step 310 at one of the pins of the analog port 0, 210 in FIG. 2. Under control of the Analog Clock 205, the analog input signal is coupled in step 320 via a MUX 215 to the input of an SC1 amplifier 221 configured as an integrator with an internal comparator. In step 330, the output of the SC1 amplifier 221 is represented as a digital input signal which is applied to two MFBs 230 configured as an eight bit digital counter. Under the control of the Interrupt Controller 206 and System Clocks 207, the two MFBs 230 accumulate and store the digital conversion of the analog input signal in step 340. The resulting digital data is then coupled in step 350 via the Independent Internal I/O Bus 240 to a digital output port such as port 0, 241 in FIG. 2.

Exemplary Digital Function

Figure 4:
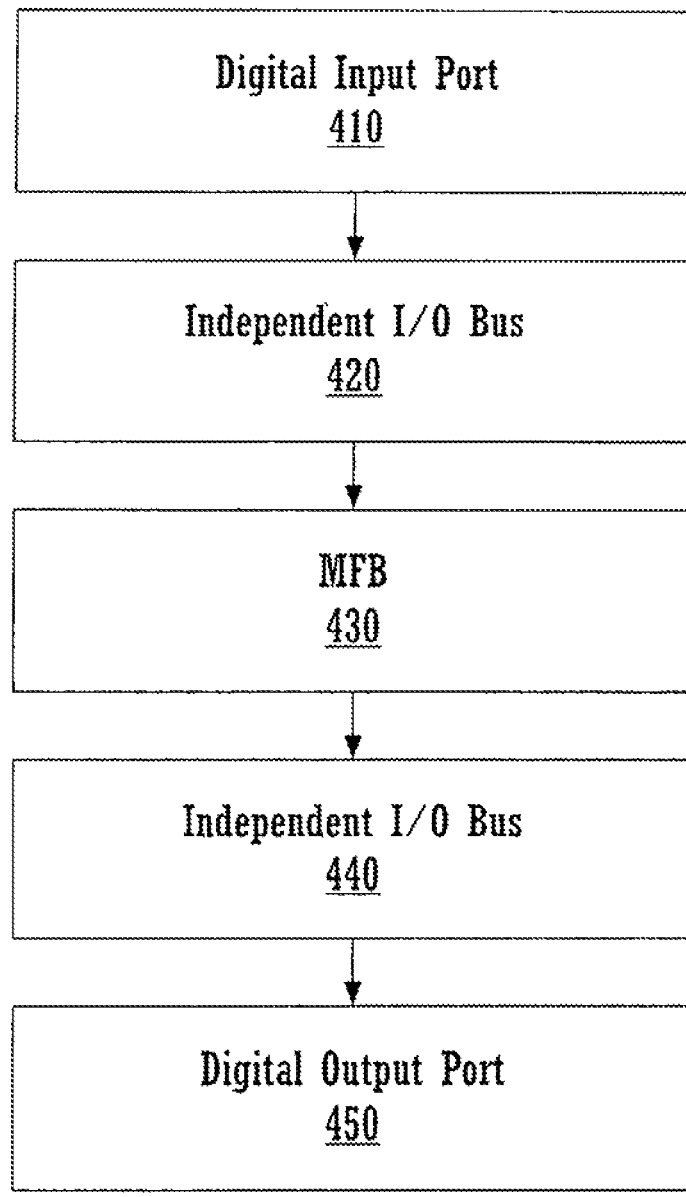
FIG. 4 is a flow chart illustrating steps in a digital operation possible with the Programmable System On-a-Chip (PsoC) according to the present invention.

FIG. 4 is a flow chart illustrating steps 400 in a digital operation possible with the Programmable System On-a-Chip (PsoC) according to the present invention. Component reference numbers used are as assigned in FIG. 2. In the present example, a series of pulses taken from an external device are to be counted and a signal is to he coupled to an output device when the count is found to be equal to a preset value. In step 410, the external series of pulses is coupled to a predetermined port and pin, such as pin 1 of port 0, 241 in FIG. 2. In step 420, the Independent Internal I/O Bus 240 is used to couple the input signal to an MFB 230. Under control of the Interrupt Controller 206 and the System Clocks 207, the MEB 230 counts pulses in sequence and compares the count to a stored preselected count. When the accumulated count equals the stored count, the MFB generates a signal which is coupled in step 450 to a preselected output port and pin by the Independent Internal I/O Bus 240. It is to be appreciated that a series of pulses taken from an external device that are not satisfactory digital signals could be entered as an analog signal which is then routed through an analog amplifier ACT 220, SC1 221 or SC2 222 it order to produce a digital signal that is then routed to a designated MFB 230.

The preferred embodiment of the present invention, PSoC architecture (mixed analog/digital), is thus described. While the present invention has been described in particular embodiments, it should be appreciated that the present invention should not be construed as limited by such embodiments, but rather construed according to the below claims.

What is claimed is:

1. A circuit comprising:
an IO port;
a plurality of analog circuit blocks comprising:
   a first analog circuit block programmable to perform a first function when configured in a first configuration and a second function when configured in a second configuration;
   a second analog circuit block programmable to perform a third function when configured in a third configuration and a fourth function when configured in a fourth configuration;

a third analog circuit block programmable to perform a fifth function when configured in a fifth configuration and a sixth function when configured in a sixth configuration;

wherein each of the plurality of analog circuit blocks comprises an input; and a programmable interconnect structure coupled to each of the plurality of analog circuit blocks and the IO port, configured to couple at least the input of each of the plurality of analog circuit blocks to each other and to the IO port, wherein the configuration of each of the plurality of analog circuit blocks and of the programmable interconnect structure is programmable during operation.

2. The circuit of claim 1, wherein at least two of the first function, the third function, and the fifth function together comprise at least part of a complex analog function.

3. The circuit of claim 1, wherein at least one of the plurality of analog circuit blocks is of a type selected from the group consisting of a continuous time circuit block and a switched capacitor circuit block.

4. The circuit of claim 1, wherein at least one of the plurality of analog circuit blocks has a fixed function with programmable parameters.

5. The circuit of claim 1, wherein the IO port comprises a plurality of pins each programmable in accordance with data stored in memory to perform at least one of an input pin function and an output pin function.

6. The circuit of claim 1, further comprising an internal bus coupling the plurality of analog circuit blocks to the programmable interconnect structure, over which programming information is transferred to configure the function of the plurality of analog circuit blocks and the programmable interconnect structure.

7. The circuit of claim 1, wherein the configuration of at least one of the programmable interconnect structure, the first analog circuit block, the second analog circuit block, and the third analog circuit block is configurable according to dynamically programmable configuration data.

8. The circuit of claim 1, further comprising a plurality of programmable digital circuit blocks coupled to the IO port and the first analog circuit block by the programmable interconnect structure.

9. A method comprising:
configuring a first analog circuit block comprising a first input to perform a first function in accordance with dynamically programmable configuration data;
configuring a second analog circuit block comprising a second input to perform a second function in accordance with dynamically programmable configuration data;
configuring a third analog circuit block comprising a third input to perform a third function in accordance with dynamically programmable configuration data; and
configuring a programmable interconnect structure to couple together at least an IO port, the first input, the second input, and the third input in accordance with dynamically programmable configuration data.

10. The method of claim 9 further comprising:
dynamically reconfiguring the first analog circuit block to perform a fourth function in accordance with the dynamically programmable configuration data;
dynamically reconfiguring the second analog circuit block to perform a fifth function in accordance with the dynamically programmable configuration data; and dynamically reconfiguring the third analog circuit block to perform a sixth function in accordance with the dynamically programmable configuration data.

11. The method of claim 9, wherein programming the first analog circuit block to perform the first function and programming the second analog circuit block to perform the second function comprises programming the first and second analog circuit blocks in combination to implement at least part of a complex analog function.

12. The method of claim 9, further comprising configuring the programmable interconnect structure to couple at least one of the IO port and the first analog circuit block to the third analog circuit block, the third analog circuit block having a fixed function with programmable parameters.

13. The method of claim 9, further comprising configuring each pin of the IO port in accordance with data stored in memory to perform at least one of an input pin function and an output pin function.

14. The method of claim 9, wherein programming the programmable interconnect structure comprises transferring programming data over an internal bus coupled to the programmable interconnect structure.

15. The method of claim 9, further comprising configuring a digital circuit block coupled to the IO port and the programmable interconnect structure to perform a seventh function in accordance with dynamically programmable configuration data.

16. A method comprising:
providing an IO port;
providing a plurality of analog circuit blocks comprising:
a first analog circuit block programmable to perform a first function when configured in a first configuration and a second function when configured in a second configuration;
a second analog circuit block programmable to perform a third function when configured in a third configuration and a fourth function when configured in a fourth configuration; and
a third analog circuit block programmable to perform a fifth function when configured in a fifth configuration and a sixth function when configured in a sixth configuration;
wherein each of the plurality of analog circuit blocks comprises an input;
providing a programmable interconnect structure coupled to the plurality of analog circuit blocks and the IO port, and configured to couple at least the input of each of the plurality of analog circuit blocks to each other and to the IO port; and
configuring the plurality of analog circuit blocks and the programmable interconnect structure in accordance with dynamically programmable configuration data.

17. The method of claim 16, wherein the third analog circuit block has a fixed function with programmable parameters.

18. The method of claim 16, further comprising configuring each pin of the IO port in accordance with data stored in memory to perform at least one of an input pin function and an output pin function.

19. The method of claim 16, further comprising:
providing an internal bus coupling plurality of analog circuit blocks and the programmable interconnect structure; and
transferring programming information over the internal bus to configure the function of the plurality of analog circuit blocks and the programmable interconnect structure.

20. The method of claim 16, further comprising providing a plurality of programmable digital circuit blocks coupled to the IO port and the first analog circuit block by the programmable interconnect structure.

\* \* \* \* \*